United States Patent [19]
Astrachan

[11] Patent Number: 5,612,974
[45] Date of Patent: Mar. 18, 1997

[54] CONVOLUTIONAL ENCODER FOR USE ON AN INTEGRATED CIRCUIT THAT PERFORMS MULTIPLE COMMUNICATION TASKS

[75] Inventor: Paul M. Astrachan, Austin, Tex.

[73] Assignee: Motorola Inc., Schaumburg, Ill.

[21] Appl. No.: 333,160

[22] Filed: Nov. 1, 1994

[51] Int. Cl.⁶ .................................................. H04L 27/04
[52] U.S. Cl. .............................. 375/295; 375/377; 371/43
[58] Field of Search ..................................... 375/260, 224, 375/225, 295, 377; 371/43, 45

[56] References Cited

U.S. PATENT DOCUMENTS 4,881,241 11/1989 Pommler et al. ..................... 375/260
5,027,374 6/1991 Rossman .............................. 375/94

OTHER PUBLICATIONS

Rhee; "Error–Correcting Coding Theory;" McGraw–Hill Pub. Company; Chapter 4, pp. 89–113; and Chapter 9; pp 311–349 (1989).

Atal, et al.; "Advances In Speech Coding;" Kluwer Academic Publishers; Chapter 4; pp. 37–45; and Chap. 7; pp. 69–79 (1991).

Lin; "Error Control Coding Fundamentals and Applications;" (1983).

Regenold; "A Single–Chip Multiprocessor DSP Solution For Communications Applications;" IEEE; pp. 437–440 (Apr. 1994).

AT&T Microelectronics; "SCEPTRE;" AT&T GSM Hardware Platform, Conversion Signal Processor (CSP); RF Transceiver, etc,; (Feb., Mar., Apr. 1994).

Astrachan, et al; "Testing a DSP–Based Mixed–Signal Telecommunications Chip;" IEEE; pp. 669–677 (1992).

32–Bit Microprocessor User's Manual Third Edition by Motorola; Secion 1 Introduction; pp. 1–1 –1–10 (1989).

M68040, MC68EC040, MC681LC040 Microprocessors User's Manual by Motorola; Section 1 Introduction; pp. 1–1 –1–20 (1992).

MC68030 Enhanced 32–Bit Microprocessor User's Manual Third Edition by Motorola; Section 1 Introduction; pp. 1–1 –1–16 (1990).

Furui; "Digital Speech Processing, Synthesis, and Recognition;" by Marcel Dekker, Inc.; Ch. 5; pp. 100–101 (1989).

*Primary Examiner*—Stephen Chin
*Assistant Examiner*—T. Ghebretinsae

[57] ABSTRACT

A convolutional encoder may be accomplished by providing a first register, a plurality of logic gates, a sampler, a second register, and a sequencer. In operation, the first register receives digital information at a code rate which convolutionally encoded by the plurality of logic gates to produce, based on the code rate, encoded samples. The sampler extracts the encoded samples at an extraction rate and provides them to the second register. To control this operation, the sequencer generates the code rate and the extraction rate based on a count value.

10 Claims, 25 Drawing Sheets

(461) $S_t = S_n + e_{1a}$, WHERE $S_n$ = SPEECH; $S_t$ = ACTUAL (463) $S_{t+1} = S_{n+1} + e_{1b} + e_{2a}$ (465) $S_{t+2} = S_{n+2} + e_{1c} + e_{2b} + e_{3a}$
TO RECAPTURE DESIRED SIGNAL (467) $S_n = S_t$ − ECHO SIGNALS (469) $S_t = S_n + (e_{n0}) + (e_{(n-1)_1}) + (e_{(n-2)_2}) \cdots$ (471) $S_t = S_n + \sum_{i=0}^{M} (e_{(n-1)_i})$ (473) $S_n' = S_t + \sum_{i=0}^{M} (e_{(n-1)_i})$   $e_i = a_i S_i$ (475) $S_n' = S_t - \sum_{i=0}^{M} a_i (S_{(n-1)_i})$

M = ECHO DECAY TIME PERIODS

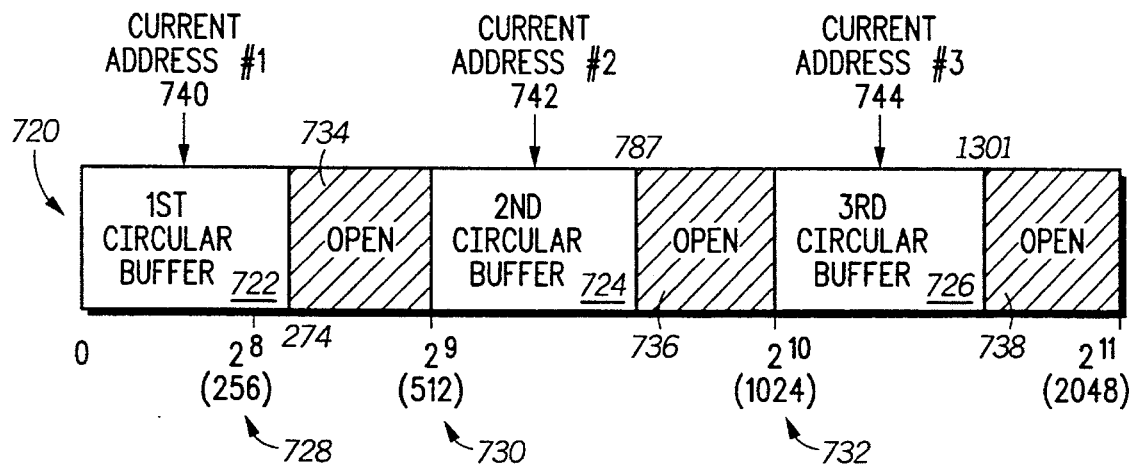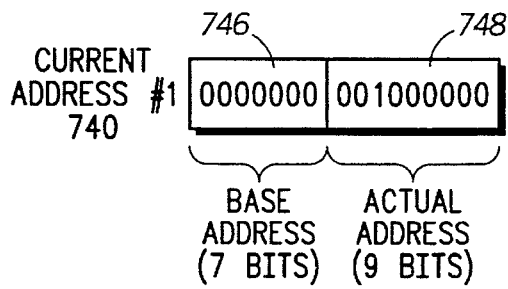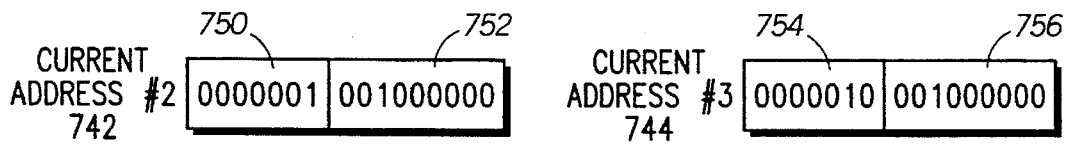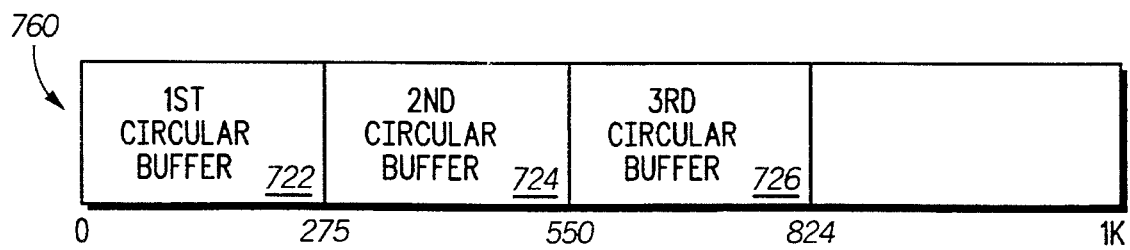
FIG.20
—PRIOR ART—

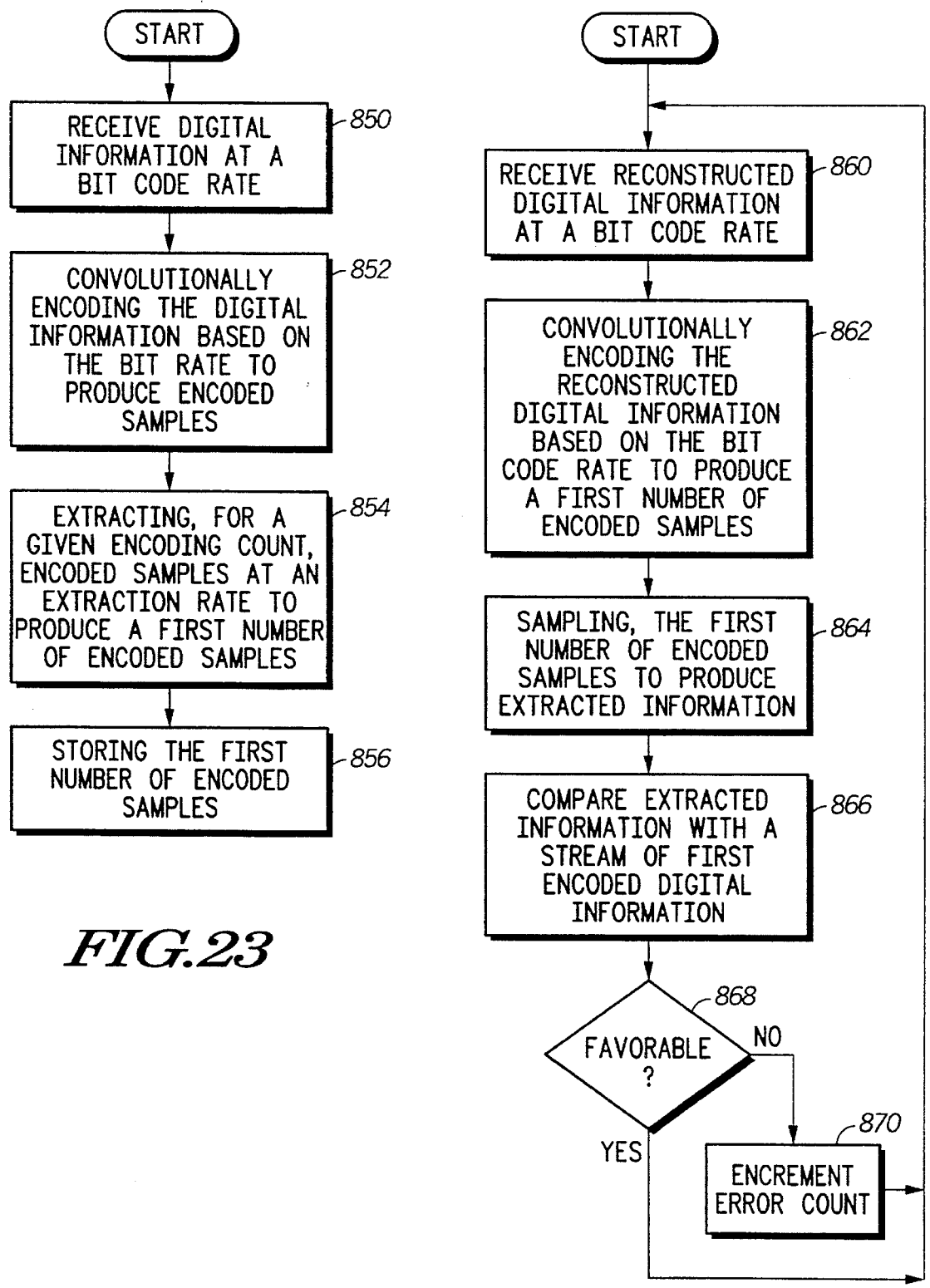

CONVOLUTIONAL ENCODER FOR USE ON AN INTEGRATED CIRCUIT THAT PERFORMS MULTIPLE COMMUNICATION TASKS

TECHNICAL FIELD OF THE INVENTION

The present invention relates generally to integrated circuits and more particularly to a method and apparatus for performing a multitude of communication tasks on a single integrated circuit.

BACKGROUND OF THE INVENTION

Wireless communication devices, such as cellular telephones, mobile radio/telephones and portable radio/telephones, operate by sending a request for a wireless communication service to a communication resource controller. The request typically contains the requesting unit's individual identification code (ID), the type of service requested, and identity of a target unit, where the target unit may be a wireless communication unit or a wireline communication unit. The types of wireless services that may be requested include one-to-one communications (i.e., private calls), one-to-many communications (i.e., group or conference calls), data transmissions, and/or telephone interconnect calls (i.e., calling a wireline telephone user). For example, if the requesting unit desires to place a private call to another communication unit, the request would include the requesting unit's ID, the target unit's ID, and a private call request.

Upon receiving the request, a communication resource controller determines whether the requesting communication unit is authorized to access a wireless communication system and the requested service. If authorized, the communication resource controller interprets the service requested and identity of the target unit. Depending on the service requested and identity of the target unit, the communication resource controller attempts to provide the requested service by establishing a communication path between the requesting unit and the target unit. For example, if the requested service indicates a private call between two wireless communication units that are within the coverage area of the communication resource controller, the controller can establish the private call by allocating a wireless communication resource to the wireless communication units.

If, however, the requested service indicates a private call between a requesting unit in the wireless communication system and a target unit that is a wireline communication unit, the communication resource controller needs to establish a wireless path and a wireline path for the requested communication to occur. The communication resource controller establishes the wireless path as it would for a communication between two wireless communication units, but, to establish the wireline path, the communication resource controller must be coupled to some sort of public switching network, such as the public switch telephone network (PSTN). Once the wireless and wireline paths are established, the requested service may be executed.

To ensure that a wireless communication unit manufactured by XYZ corporation can communicate with a wireless communication unit manufactured by ABC corporation, standards have been, and are being, established. In essence, the standards dictate how wireless and/or wireline communications are to be established. For example, the European standard for cellular telephone communications is the global system for mobile communications (GSM) standard. Thus, manufacturers that want to sell wireless communication units throughout Europe must design their equipment to be compliant with the GSM standard.

In addition to complying with these standards, the manufacturer must also conform their product to governmental regulations and/or laws. For example, in the United States, the Federal Communications Commission (FCC) has proscribed certain frequency bands to be used for certain types of communications. For example, land mobile communications are given one frequency band, while cellular telephone communications, commercial radio transmissions, and television transmissions are each given a different band. In addition to national regulatory requirements, state or Federal laws may limit the practicality of such wireless communication units. For example, many European countries have made it illegal to use a hand operated cellular telephone while driving an automobile, thus requiring drivers to stop their vehicles to place a telephone call or have hands-free operation.

While complying with the standards and governmental regulations, manufacturers cannot lose sight of consumer needs and requirements. Consumers are demanding that their wireless communication units be lighter weight, have extending battery life, more features, and be smaller in size. For example, consumers are requiring their cellular telephones be able to transmit and receive facsimiles, to allow their personal computers to interface with a network, and to interface audio equipment such as a headset, compact disc players, etc.

To meet the regulatory requirements, cellular telephone manufacturers may utilize a three chip set such as AT&T's GSM hardware platform. This chip set allows cellular telephone manufacturers to perform the radio frequency (RF) function of a cellular telephone, the base band modem functions, and audio codec functions. While this chip set meets the regulatory requirements, it does not provide for efficient full duplex hands free operation. To provide hands free operation, manufacturers are required to include an additional digital signal processor (DSP), such as Motorola's DSP56001 or DSP56156, programmed to perform an echo cancellation algorithm.

As is generally understood, when additional integrated circuits (IC), or chips, are needed to perform functions, additional power is consumed, additional circuit board real estate is needed, and operating speeds are slowed as information is transported between the ICs. Thus, the manufacturer of cellular telephones must provide for four chips in the layout of the cellular telephone-and limit the consumers' goal of lighter weight, smaller packages, and longer talk time.

An alternative to using the AT&T chip set is to use DSPs programmed to perform the various functions. While this will provide the needed functions, it has similar limitations as the AT&T chip set, in that many chips are needed to perform the desired functions, thus limiting the consumers' goals.

Therefore, a need exists for a method and apparatus that provides a single integrated circuit that performs the above-mentioned cellular telephone features while more readily accommodating the consumer requirements of lighter weight, smaller packages, and longer talk time.

BRIEF DESCRIPTION OF THE DRAWINGS

FIG. 20 illustrates a comparison between a prior art address generation unit and an address generation unit that is constructed in accordance with the present invention;

FIG. 23 illustrates a logic diagram that may be used to implement an encoder in accordance with the present invention;

FIG. 24 illustrates a logic diagram that may be used to implement a signal quality checker in accordance with the present invention;

Detailed Description of a Preferred Embodiment

Generally, the present invention provides a method and apparatus for producing a convolutional encoder for use on an integrated circuit that provides multiple communication functions. This is accomplished by providing a first register, a plurality of logic gates, a sampler, a second register, and a sequencer. In operation, the first register receives digital information at a code rate which convolutionally encoded by the plurality of logic gates to produce, based on the code rate, encoded samples. The sampler extracts the encoded samples at an extraction rate and provides them to the second register. To control this operation, the sequencer generates the code rate and the extraction rate based on a count value. With such a method and apparatus, multiple functions can be performed on the single IC, thus improving speed and reducing power consumption.

Figure 1:
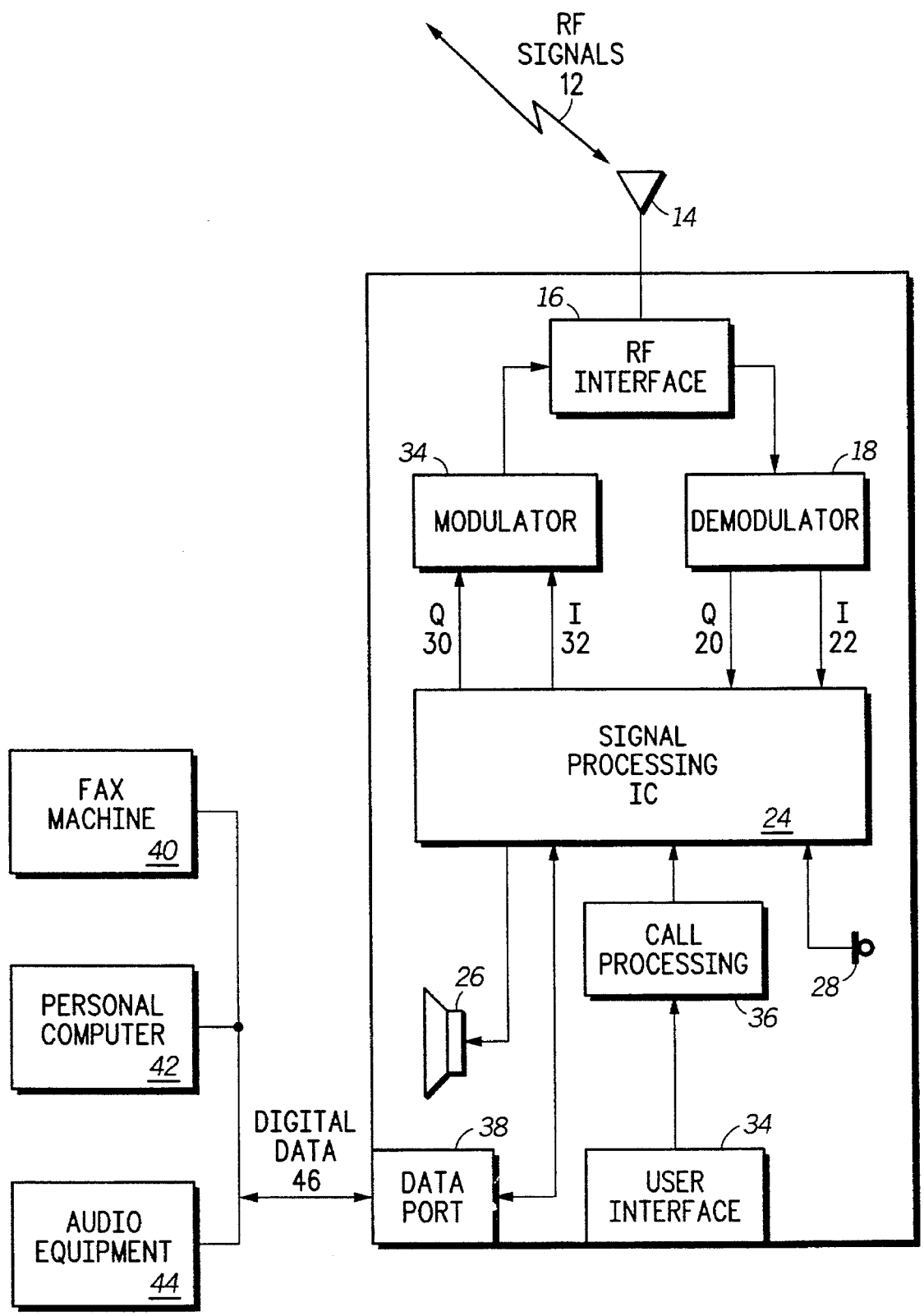
FIG. 1 illustrates a schematic block diagram of a cellular telephone in accordance with the present invention.

FIG. 1 illustrates a block diagram of a communication unit 10. The communication unit 10 comprises an antenna 14, an RF interface 16, a demodulator 18, a signal processing integrated circuit (IC) 24, a microphone 28, a speaker 26, a modulator 34, a call processing element 36, a user interface 35, and a data input port 38. In operation, an operator of the communication unit 10 initiates a service request via the user interface 35, which may be a key board, key panel, or a numerical entry pad. The service requested may be a cellular telephone call, a facsimile transmission, provide modem services for a personal computer, a conference call, or transmit a data message such as status, location, request for directions, request for a data file, etc.

Once the service request has been entered via the user interface 35, the request is routed to the call processor 36. The call processor 36, which may be a microprocessor, microcomputer, or digital signal processor, interprets the service request to prepare a message to send to a communication resource controller. The message is routed to the signal processing IC 24, wherein the signal processing IC 24 converts the message into an analog in-phase signal 32 and an analog quadrature signal 30 via an RF modem function. The in-phase and quadrature signals 30–32 are routed to the modulator 34, which modulates the signals 30–32 to a carder frequency. The modulated signals are then routed to the RF interface 16 which sends the modulated signals out over the carrier frequency, or RF channel, as radio frequency (RF) signals 12. Typically, the signals 30–32 are modulated using a modulation technique such as amplitude modulation (AM), frequency modulation (FM), quadrature amplitude modulation (QAM), guasian minimum shift keying (GMSK), phase modulation (PM), or a combination thereof. In addition, an RF channel may be formatted using time division multiplexing (TDMA), Code Division Multiplexing (CDMA), or frequency division multiplexing (FDMA), or a combination thereof, such that the RF channel can contemporaneously support several RF signals 12.

Upon receiving a response from the communication resource controller, via an RF signal 12, the response is routed to demodulator 18 via RF interface 16. Demodulator 18 demodulates the response to produce an in-phase signal 22 and a quadrature signal 20. Signal processing IC 24 receives these signal 22 and 20, extracts control information, and routes the control information to the call processor 36. Assuming that the control information granted the service request, the call processor 36 provides set-up information to the other components of the communication unit 10. For example, assume that the requested service was for a facsimile transmission. Under these conditions, the call processor 36 enables data port 38 to receive facsimile data, i.e., digital data 46, from an external facsimile machine 40 and routes it to the signal processing IC 24. Upon receiving set-up information from the call processor 36, the signal processing IC 24 produces an in-phase signal 32 and a quadrature signal 30 of the facsimile data, which is subsequently transmitted via an RF signal 12. The call processor 36, the data port 38, and the signal processing IC 24 functions in a similar manner when the service requested was for a modem interface for a person computer 42, external audio equipment 44 such as codec, or an external modem.

As an alternate example, assume that the service request was for a telephone call. Under these circumstances, the call processor 36 generates set-up information that allows for full duplex communication. In the full duplex mode, audio signals received by microphone 28, are routed to the signal processing IC 24. The signal processing IC 24 converts the audio signals into an in-phase signal 32 and a quadrature signal 30. The in-phase and quadrature signals 32 and 30 are routed to the modulator 34 which in turns provides a modulated signal to the RF interface 16 which is subsequently transmitted as the RF signals 12. Simultaneously, communication signals received via the RF signals 12 are demodulated via demodulator 18 and routed to the signal processing IC 24. The signal processing IC 24 converts the demodulate signals 20–22 into analog signals which are rendered audible by the speaker 26.

While the communication unit 10 is shown having a single microphone 28 and a single speaker 26, the communication unit 10 may be equipped with a plurality of microphones and/or a plurality of speakers. When the communication unit 10 is operated in a hands free mode echo cancellation should be used to prevent feedback between the microphone(s) 28 and the speaker(s) 26.

Figure 2:
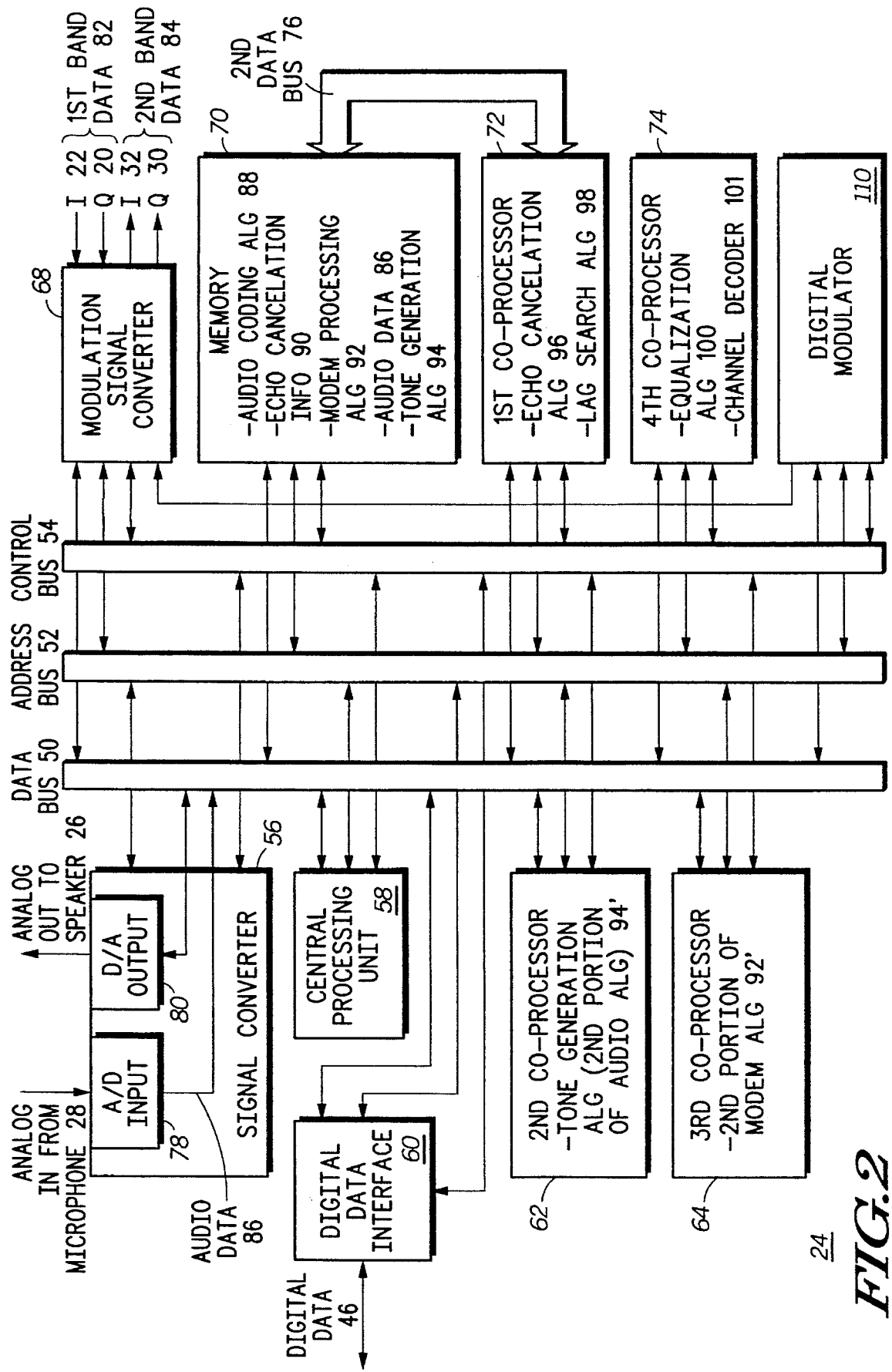
FIG. 2 illustrates a schematic block diagram of a signal processing integrated circuit in accordance with the present invention.

FIG. 2 illustrates a functional block diagram of the signal processing integrated circuit 24. As shown, the signal processing IC 24 receives analog signals from the microphone 28 via an analog-to-digital (A/D) input port 78 of a signal converter 56. The signal converter 56, which may be a CODEC similar to any one of Motorola's CODEC filters MC145500–MC145505, converts, via the A/D input port 78, received analog signals into digital audio data 86. The audio data 86 is digitized linear speech information, wherein the digitization may be done using a pulse code modulation (PCM) technique. In addition, the signal converter 56, includes a digital-to-analog (D/A) output port 80, which receives digitized information from a data bus 50 and converts the digital data into an analog output which is routed to speaker 26.

Under the control of a central processing unit (CPU) 58, the audio data 86 is routed, via the data bus 50, to a memory unit 70 where it is stored. The CPU 58 may comprise, in an integrated circuit form, a general purpose central processing unit, a central processing unit as disclosed in co-pending U.S. patent application entitled DATA PROCESSOR WITH AN EFFICIENT BIT MOVE CAPABILITY AND METHOD THEREFOR, Ser. No. 08/184,529 assigned to the same assignee as the present invention, or a central processing unit as found in Motorola's digital signal processors DSP56001 or DSP56156. The memory 70 may be any digital storage means that can be integrated on an integrated circuit such as RAM, ROM, registers, buffers, or logic gates.

Once a sufficient amount of audio data 86, i.e., digitized linear speech information, is stored in memory 70, the CPU 58 evokes an audio coding algorithm 88, which is stored in memory 70. To begin the audio coding algorithm, which includes an echo cancellation portion, a lag search portion, and/or a speech encoding portion, the CPU 58 enables a first co-processor 72, which stores the echo cancellation portion 96 in a hardware format, to perform the echo cancellation algorithm 96 upon the audio data 86 utilizing echo cancellation information 90. The echo cancellation function will be described in detail below.

Next, the CPU 58 performs the speech encoding portion of the audio coding algorithm on the echo canceled audio data to produce processed data. The speech encoding algorithm portion of the audio coding algorithm 88 may be a vector summed excited linear prediction (VSELP) algorithm, a code excited linear predictor (CELP) algorithm, a regular pulse excitation long term prediction (RPELTP) algorithm, or any other digitized speech, or audio, compression algorithm. Contemporaneous to performing the speech encoding portion, the CPU 58 enables the first co-processor 72, which stores in a hardware format the lag search portion 98, to perform the lag search portion 98 of the audio processing algorithm. From the contemporaneous execution of the speech encoding portion and the lag search portion of the audio processing algorithm, compressed digital audio information is produced and stored in memory 70 for future use.

As shown in FIG. 2, the first co-processor 72 is coupled to a primary bus structure, which includes data bus 50, address bus 52, and control bus 54, and a secondary bus 76, which includes its own data bus, address bus, and control bus. By having the dual bus structure, the first co-processor 72 can contemporaneously execute its portion of the audio coding algorithm, while the CPU 58 is executing its portion of the audio processing algorithm. With such a structure, speed of the signal processing IC 24 is improved over prior chip sets, because all portions of the audio processing algorithm are processed on the same chip, thus the extra execution steps to send and retrieve information between the chip set are not needed. In addition, because the second data bus 76 is dedicated to the first co-processor 72, it is substantially smaller in length than the primary bus 50–54, thus it takes less energy to store and retrieve information between the memory 70 and the first co-processor 72. With the first co-processor performing portions of the audio processing algorithm, a substantial amount of information is transported over the second data bus 76, which produces energy saving of 10–30% over chip sets. With such energy savings, the signal processing IC 24 fulfills the consumer need of reduced power consumption such that battery life can be extended.

Having stored the compressed digitized audio information (i.e., the resultant of the CPU 58 and the first co-processor 72) in memory 70, the CPU 58 prepares this information for RF transmission by evoking an outbound portion of a modem processing algorithm 92. The outbound portion of the modem processing algorithm 92 may be any one of a number of algorithms which converts the compressed digitized audio information into an in-phase and quadrature signals 30–32. For example, the outbound portion of the modem processing algorithm 92 may be comprises of a plurality of portions which include a block encode or convolution encode portion, an interleave portion, an encryption portion, and a burst formation portion.

While the central processing unit 58 is executing portions of the modem processing algorithm 92 to produce transmit data, it also enables a third co-processor 64 to execute the block encode portion and, when included, the encryption portion. The third co-processor 64 will be discussed in detail below. Once the CPU 58 and the third co-processor 64 have completed their respective portions of the modem processing algorithm 92, the resulting processed data is routed via the data bus 50 to a digital modulator 110. The digital modulator 110 receives the resulting processed data and modulates that into a first digital in-phase signal and a first digital quadrature signal which are subsequently routed to the modulation signal converter 68. The modulation signal converter 68, which may be any device that converts digital in-phase and quadrature signals into analog in-phase and quadrature signals 30–32, produces second band data 84 from the digital information received. The second band data 84 may be at base band, or at any intermediate frequency depending upon the particular application needs of the communication unit 10.

RF signals 12 received via the antenna 14 are converted to first band data 82, wherein the first band data 82 may be converted to base band signals, or to any selected intermediate frequency. The first band data 82 comprises the in-phase and quadrature signals 20 and 22 which are routed to the modulation signal converter 68. The modulation signal converter 68 converts the in-phase and quadrature signals 20 and 22, which are analog signals, into digital in-phase and quadrature signals. The digital in-phase and quadrature signals may be provided to the memory 70 via a fast interrupt routine or direct memory access (DMA), or any other techniques for down loading digital information into a memory.

With the digital in-phase and quadrature signals stored in memory 70, the central processor 58 begins executing an inbound portion of the modem processing algorithm 92. The inbound portion of the modem processing algorithm 92 is essentially the reverse of the outbound portion of the modem processing algorithm. For example, the inbound portion of the modem processing algorithm may include an equalization portion, a decryption portion, and a channel decode portion. The equalization portion includes a metric generation portion, which is performed by the CPU 58, and an Add/Compare/Select portion, which is performed by a fourth co-processor. The fourth co-processor 74 may be a co-processor as the one defined in U.S. Pat. No. 5,027,374 issued to Mark Rossman, entitled "BIT SERIAL VITERBI DECODER ADD/COMPARE/SELECT ARRAY", assigned to the same assignee as the present invention.

The decode portion of the inbound portion of the modem processing algorithm includes a deinterleave portion, a block decode portion, a cycle redundancy check (CRC) portion, and a receive quality check portion. The deinterleave portion, which is the inverse of the interleave function, is performed by the CPU 58, while the third co-processor 64 performs the CRC portion and the receive quality check portion, and the fourth co-processor 74 performs, in conjunction with the CPU 58, the block decode function, which is the inverse of the block encode function.

Upon completion of the inbound portion of the modem processing algorithm 92, the CPU 58 and the third and fourth co-processors 64, 74 yield compressed digital audio information. At this stage, the modem processing algorithm is complete and the CPU 58 begins executing the audio decoding algorithm. The audio decoding algorithm is essentially the inverse of the audio coding algorithm such that the compressed digital information is decompressed. For example, the VSELP technique will provide both the audio coding and decoding algorithms as will the other compression and decompression techniques previously mentioned. Having generated the decompressed audio information, the CPU 58 routes the information to the signal converter 56. The signal converter 56 converts this digital information to analog information via the D to A output port to 80. Having converted this information to an analog signal, it is routed to speaker 26.

In addition to providing speech, audio or any type of analog signaling, the signal processing IC 24 also processes digital data 46. To process digital data 46, the IC 24 includes a digital data interface 60 which receives the digital data 46 from the data port 38 (FIG. 1). The CPU 58 routes the digital data 46 to memory 70 via the data bus 50, wherein the digital data 46 is subsequently processed via the outbound portion of the modem processing algorithm to produce the second band data 84.

Conversely, when digital data is received as the first band data 82, it is routed to the modulation signal converter 68. The modulation signal converter 68 performs similar functions upon the digital data as it did on the audio signals, which was described above. For received digital signals, however, the decompressed digital information is not routed to the CPU 58 for audio processing, but to the digital data interface 60 which subsequently routes it to one of the digital equipment coupled to the data port 38.

The integrated circuit 24 is also shown to include a second co-processor 62 which performs a tone generation algorithm as a second portion of the audio algorithm 94'. The tone generation algorithm produces tone signals which are routed to the speaker 26 as digitized audio information which has been described above. The tone generation signals are utilized to indicate key pad actuation, call progress tones, call indication signals, or dual tone multi frequency (DTMF). In addition, the tones generated may also be processed via the audio coding algorithm and the modem processing algorithm and prepared, as described above, as the second band data 84. The tones generated by the second co-processor 62 may be done in a variety of ways. For example, representations of a sinusoidal signal may be stored in the memory and reconstructed in any frequency and amplitude via the second co-processor to produce the desired tones.

Figure 3:
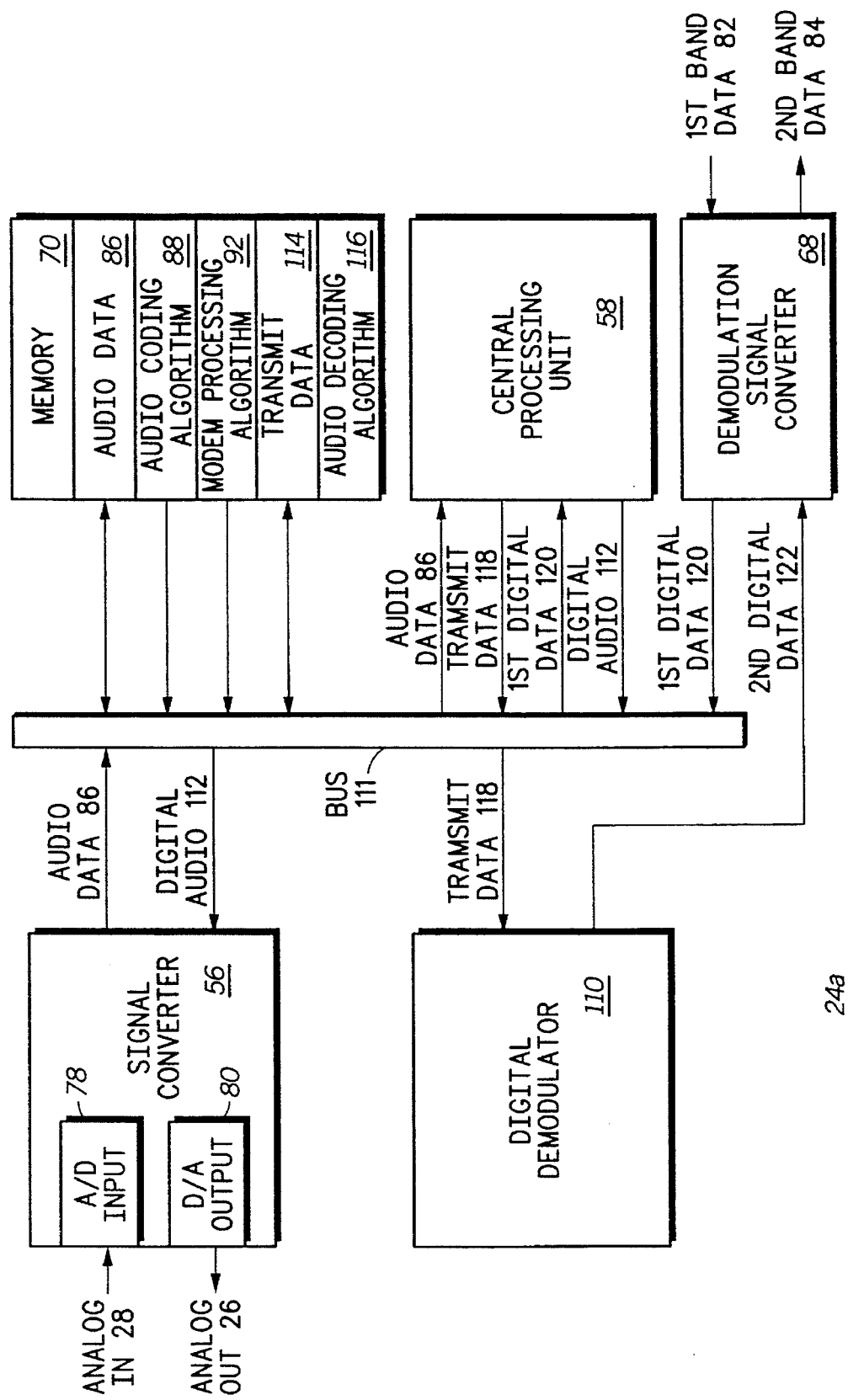
FIG. 3 illustrates a schematic block diagram of an alternate embodiment of a signal processing integrated circuit in accordance with the present invention.

FIG. 3 illustrates an alternative embodiment of the signal processing IC 24A. The signal processing IC 24A includes a signal converter 56, memory 70, a digital modulator 110, a central processing unit (CPU) 58, a modulation signal converter 68, and a bus 111. In this embodiment, analog signals are received by the A/D converter 78 of the signal converter 56, which may be CODEC, and digitized to produce audio data 86. Recall that the audio data 86 is digitized linear speech information, wherein the digitization may be done by a using a pulse code modulation (PCM) technique. As the audio data 86 is being generated, it is routed to memory 70, via the bus 111, and stored therein.

When a sufficient amount of the audio data 86 is stored in memory 70, the CPU 58 begins converting the stored audio data 86 into transmit data 118. For this discussion, a sufficient amount of stored audio data 86 is based on frame size.

As the analog audio signals are received from the microphone 28, the signal converter 56 converts the analog signals into digitized linear speech information which is packetized into frames of a given time length. For example, the frame length may by in the range of 10 μSec to 10 M Sec. Each frame, or packet of digitized linear speech information, contains a certain number of digitized samples, wherein the number is based on the sampling rate of the signal converter 56 and the frame length. For example, if the sampling rate is 8 KHz and the frame length is 20 mSec, there will be 160 digitized samples per frame.

The CPU 58 generates the transmit data 118 from the audio data 86 by first executing a portion of the audio coding algorithm 88 and then executing a portion of the modem processing algorithm 92. As previously mentioned, the CPU's 58 portion of the audio coding algorithm includes the speech encoding algorithm, which may be vector summed excited linear prediction (VSELP), code excited linear prediction (CELP), or regular pulse excitation long term prediction (RPELTP). Having performed the speech encoding algorithm, the CPU 58 then performs an outbound portion of the modem processing algorithm 92 on the speech encoded data. The outbound portion converts the speech encoding information into the transmit data 118, wherein the transmit data 118 is formatted in compliance with the GSM standard. In particular, the transmit data 118 includes information bits, whether they be audio or data, mid amble bits (training sequence information), and guard bits.

As the transmit data 118 is being generated, it is routed to memory 70, via the bus 111, and stored therein. When a sufficient amount of transmit data 118 is stored in memory 70, the CPU 58 instructs the digital modulator 110 to retrieve the transmit data 118 from memory 70. The digital modulator converts the transmit data 118 into second digital data 122, wherein the second digital data 122 comprises a digital in-phase signal and a digital quadrature signal. The second digital data 122 is routed directly to the modulation signal converter 68 which converts the second digital data 122 into second band data 84. The second band data 84 is then routed, via the RF interface 16 of the communication unit 10, to the antenna 14 and transmitted as outbound RF signals 12.

Inbound RF signals 12 which have been converted to first band data 82 are received via the modulation signal converter 68. The modulation signal converter 68 converts the first band data 82 into first digital data 120, wherein the first digital data 120 comprises a digital in-phase signal and a digital quadrature signal. As the first digital data 120 is being generated, it is routed to the CPU 58 via the data bus 111. Upon receiving the first digital data, the CPU 58 performs an inbound portion of the modem processing algorithm 92, which includes decryption and channel decode algorithms. Having produced decoded information via the inbound portion of the modem processing algorithm, the CPU 58 performs a portion of the audio processing algorithm, which includes the speech decoding algorithm, on the decoded information to produce digital audio 112. The digital audio 112 is placed on the bus 111 and routed to the signal converter 56 which converts the digital audio 112 into an analog signal and routes the analog signals to the speaker 26 via the D/A converter 80.

Figure 4:
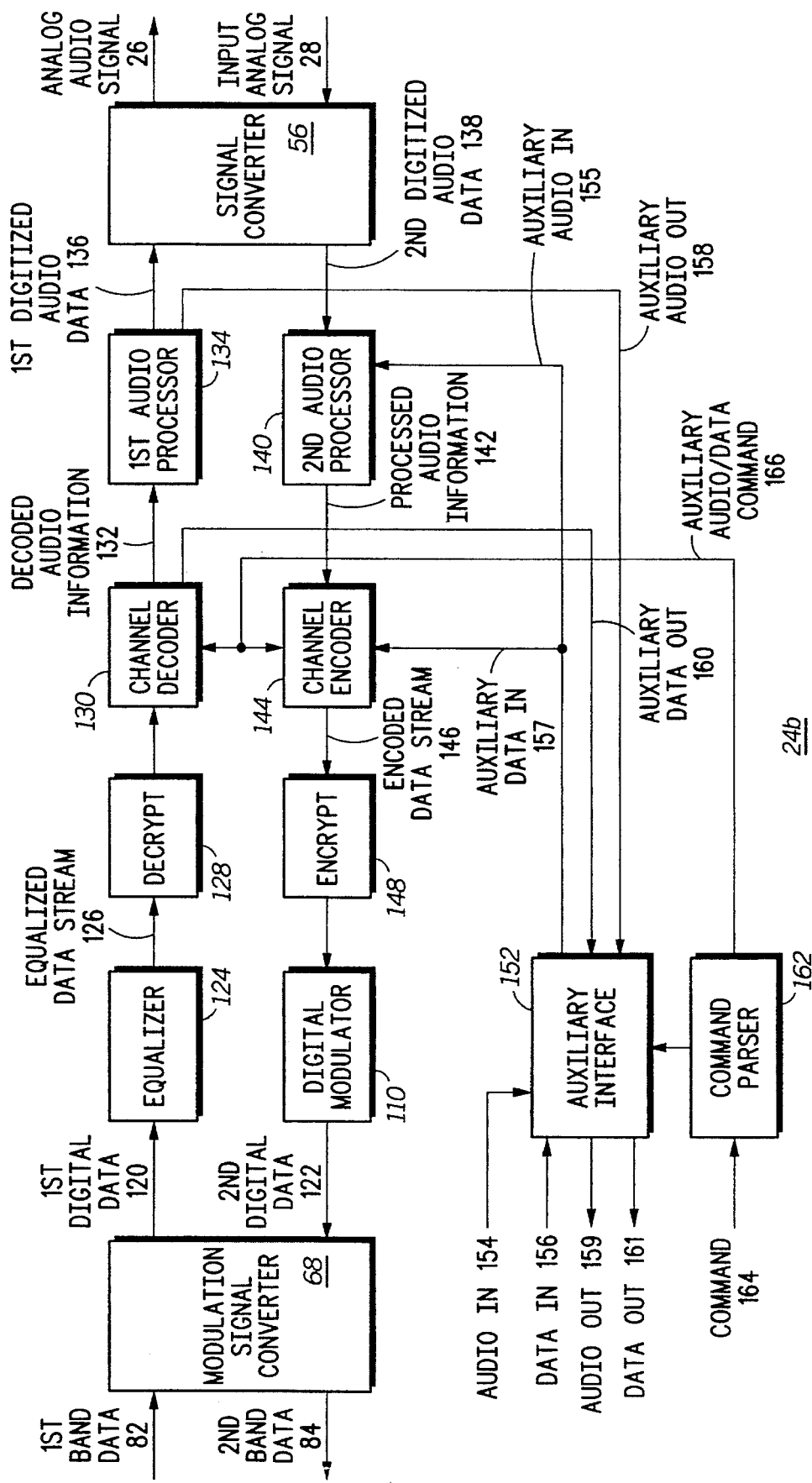
FIG. 4 illustrates yet another alternate embodiment of a signal processing integrated circuit in accordance with the present invention.

FIG. 4 illustrates yet another alternate embodiment of the signal processing IC 24B. As shown, the modulation signal converter 68 receives first band data 82 and converts it to first digital data 120. This conversion involves converting the analog in-phase signal and the analog quadrature signal, which represents the first band data 82, into a digital in-phase signal and a digital quadrature signal, which represents the first digital data 120. Because the first band data 82 is a demodulated RF signal, it is corrupted due to interferences over the RF transmit path. The interferences result from the RF signals reflecting off of buildings, mountains, hills, etc., from other RF signals transmitted in the area of the communication unit, and from imperfections in the circuitry of the communication unit. This corruption-carries over into the first digital data 120.

To begin to remove the corruption from the first digital data 120 and to recapture the digital information contained therein, an equalizer 124 converts the first digital data 120 into an equalize data stream 126. This equalization process involves interpreting the first digital data to best identify the actual transmitted data. This process will be discussed further with reference to FIG. 5. The equalized data stream 126 is routed to an optional decryption element 128. Depending upon the particular use of the communication unit, the decryption unit 128 may or may not be included. For example, when secure communications are required, the decryption element 128 will be utilized otherwise it will not be included in the process. Details of the decryption unit's 128 function will be discussed in more detail with reference to FIG. 5.

The channel decoder 130 receives the equalized data stream 126, or a decrypted version of the equalized data stream 126, and converts it to decoded audio information 132. This is generally accomplished by de-interleaving the equalized data stream 126 to produce a de-interleaved data stream. The de-interleaved data stream is then decoded, which may be an inverse convolution function, and is then verified by a cycle redundancy check (CRC) to produce the decoded audio information 132. Details of the channel decoder 130 will be described in detail with reference to FIG. 5.

Once the decoded audio information 132 is generated, it is routed to the first audio processor 134 which converts the decoded audio information 132 into first digitized audio 136. This may generally be accomplished by utilizing a speech decoding algorithm, such as VSELP, CELP, or RPELTP. The details of this process will be discussed below with reference to FIG. 5. Having converted the decoded audio information 132 into the first digitized audio data 136, the first digitized audio data 136, which includes a digital in-phase signal and a digital quadrature signal, is converted to an analog audio signal by the signal converter 56. The analog audio signal is converted to an audible signal by the speaker 26 of the communication unit 10 of FIG. 1.

The preceding discussion of FIG. 4 has focused on the communication unit 10, and subsequently the signal processing IC 24B, receiving audio information via the RF channels. In addition to receiving audio information via the RF channels, the communication unit 10, and subsequently the signal processing IC 24B, can receive data via the RF channels. In this situation, the data, which may be received RF facsimile transmissions, received personal computer transmissions, communication set-up information, and received digital data for a piece of audio equipment, is received as the first band data 82. As with received audio signals, the data is convened to first digital data 120 by the modulation signal converter 68, equalized by the equalizer 124, decrypted by decryption element 128, and decoded by the channel decoder 130. At this point, however, the decoded data, or auxiliary data output 160, is routed to an auxiliary interface 152. The data 160 is routed to the auxiliary interface 152 instead of the first audio processor 134 because a command parser 162 provides an auxiliary audio/data command to the channel decoder 130 which instructs the channel decoder 130 to route the data to the auxiliary interface 152.

The command parser 162, which may be incorporated in the CPU 58, generates the auxiliary audio/data command 166 based on signals received from the call processors 36 of the communication unit 10 of FIG. 1. For example, the call processor 36 will provide the command parser 162 with signals that indicate whether analog signals or data signals will be received via the RF channels, whether the received analog signals will be routed to the signal converter 56 or the auxiliary interface 152, whether audio signals received by the microphone 28, data received by the auxiliary interface, or audio received by the auxiliary interface will be routed to the modulation signal converter 68 for subsequent RF transmissions. Note that the auxiliary interface 152 may be a general purpose IC input/output port or a plurality of ports or it may be a serial port with a built in Time Division Multiplexing (TDM) framing structure.

Continuing with the discussion of FIG. 4, the communication unit 10, and subsequently the signal processing IC 24B, may receive audio signals via microphone 28 which are, in turn, provided to the signal converter 56. Note that the communication unit 10 may be a full duplex device, meaning it could be receiving and transmitting audio and/or data via the RF channels simultaneously, thus the signal processing IC 24B may be performing multiple communication tasks at any given time. For example, the signal processing IC 24B may be processing audio information received via the microphone 28 and the signal converter 56 while it is processing audio information received from the antenna 14 and the modulation signal converter 68.

Upon receiving the audio signals, the signal converter 56 converts the input analog signals into second digitized audio data 138, wherein the second digitized audio data 138 may be digitized linear speech information generated using a pulse code modulation (PCM) technique. Next, the second audio processor 140 converts the second digitized audio data 138 into processed audio information 142. The second audio processor 140 may perform a speech encoding algorithm such as VSELP, CELP, or RPELTP, an echo cancellation algorithm, and/or a lag search algorithm which will be discussed in greater detail with reference to FIG. 6.

As the processed audio information 142 is generated, it is routed to the channel encoder 144. As the channel encoder 144 receives the processed audio information 142, it converts the processed audio information into an encoded data stream 146. This is generally accomplished by performing a block encode, or convolutional encode, a cyclic redundancy check, and an interleave function on the processed audio information which will be discussed in more detailed with reference to FIG. 6. The encoded data stream 146 is then provided to an encryption element 148, which encrypts the encoded data stream 146 to produce an encrypted data stream. Note that the signal processing IC 24B may not include an encryption block 148 or a decryption block 128 depending on the communication unit requirements. If the communication unit requires an encryption function, the type of encryption may vary greatly depending on the level of security desired. For example, the encryption may vary from a public keying system to a Type 1 Federal Encryption Standard.

Regardless of whether the signal processing IC 24B has an encryption block 148, the digital modulator 110 receives the encoded data stream 146, or an encrypted version thereof, and converts it into second digital data 122. The second digital data 122 includes a digital in-phase signal and a digital quadrature signal which are provided to the modulation signal converter 68. The modulation signal converter 68 converts the second digital data 122 into second band data 84, i.e., the modulation signal converter 68 converts the digital in-phase and quadrate signals into analog in-phase and quadrature signals. As described above, the second band data 84 is processed by the modulator 34 of the communication unit 10 and subsequently transmitted as RF signals 12, which are shown in FIG. 1.

Continuing with the description of the signal processing IC 24B of FIG. 4, the signal processing IC 24B is also capable of processing auxiliary information, wherein the auxiliary information may be either data or audio. When the auxiliary information is data, such as facsimile transmission or reception information, modem information for a personal computer, general modem information, or digital audio equipment information, the signal processing IC 24B receives the data 156 from one of the peripheral data devices via the data port 38 of the communication unit 10 and the auxiliary interface 152. The auxiliary interface 152 routes the data input 156, or a representation thereof, to the channel encoder 144 as auxiliary data input 157. Note that the auxiliary interface 152 may have to manipulate the data input 156, by adjusting its baud rate, placing it in a TDM slot, or adding framing information to produce the auxiliary data input 157. For example, if the data input 156 is being received at 4800 baud rate, while the GSM standard requires a higher baud rate, the auxiliary interface 152 will produce the auxiliary data input 157 at the GSM required baud rate.

Upon receiving the auxiliary data input 157, the channel encoder 144 converts it into an encoded data stream 146. The encoded data stream 146 is then encrypted by encryption block 148, converted to a second digital data 122 by the digital modulator, and finally converted to second band data 84 by the modulation signal converter 68. After being converted to the second band data 84, it is transmitted as an RF signal 12, via the appropriate components of the communication unit 10.

In addition to receiving auxiliary data, the signal processing IC 24B may also transceive auxiliary audio data input 154 and auxiliary audio output 159 via the auxiliary interface 152. Upon receiving the auxiliary audio input 154, the auxiliary interface 152 routes it, as auxiliary audio 155, to the second audio processor 140. The second audio processor 140 processes the auxiliary audio 155 in a similar manner as it processed the second digitized audio data 138. Thus, the auxiliary audio 155 will subsequently be converted into the second band data 84 and transmitted as RF signals 12.

The signal processing IC 24B provides the auxiliary audio output 159 to the peripheral devices via the auxiliary interface 152 and the data port 38 of the communication unit 10. Generally, the auxiliary audio output 159 is produced in a similar manner as the audio signals provided to the speaker 26, except that instead of the routing the first digitized audio data 136 to the signal converter 56, it is routed as auxiliary audio 158 to the auxiliary interface 152. The auxiliary interface 152 processes the auxiliary audio 158 to produce the auxiliary audio output 159, wherein the processing depends upon the type of audio equipment 44 that receives the audio output data 159. Note that the utilization of the auxiliary paths is controlled by the command parser 162 as described above.

Figure 5:
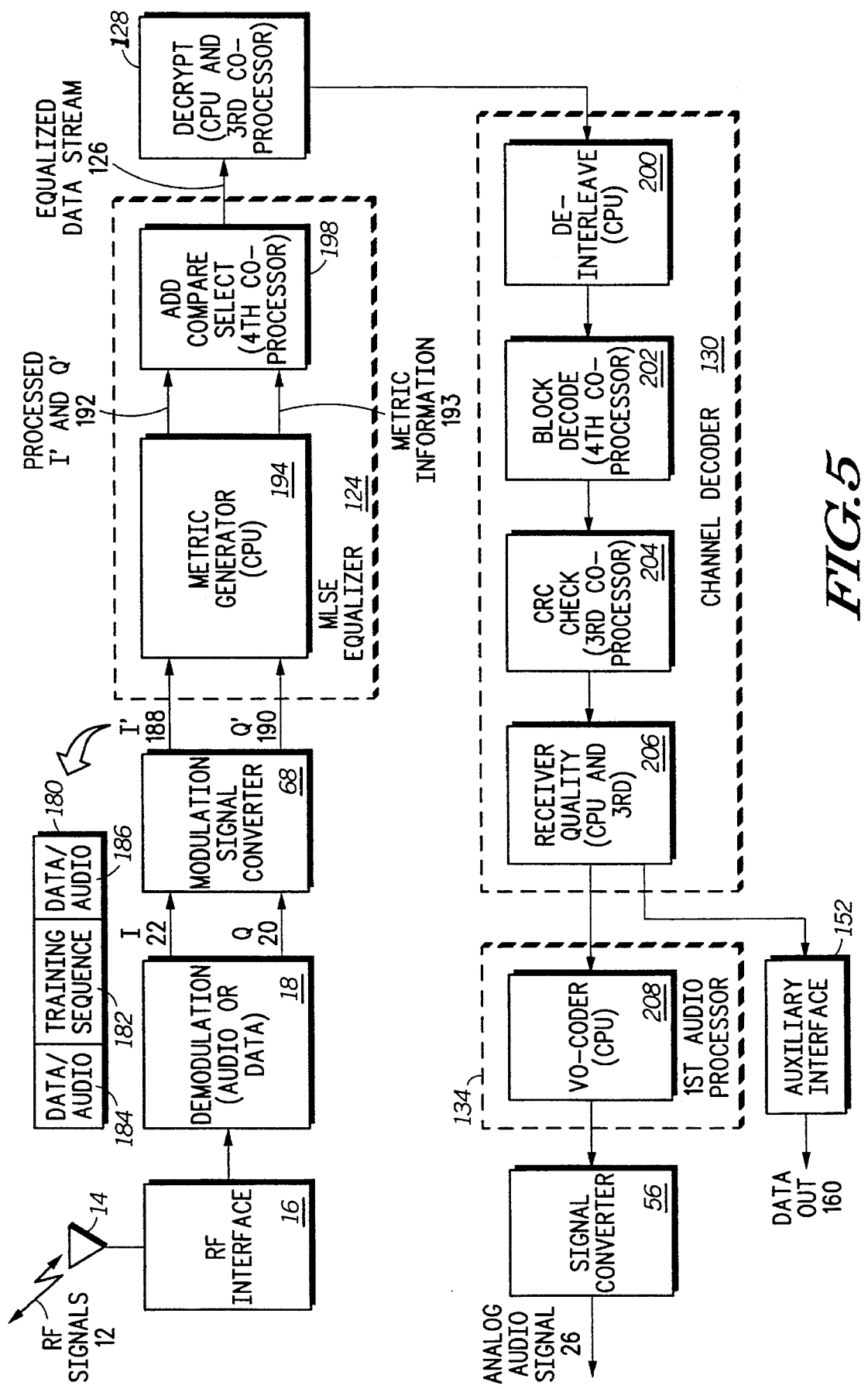
FIG. 5 illustrates a functional block diagram of a portion of the signal processing integrated circuit in accordance with the present invention.

FIG. 5 illustrates a detailed block diagram of the inbound RF receive path for the signal processing ICs 24, 24A, 24B. As shown, RF signals 12 are received by antenna 14 and routed to the RF interface 16 of the communication unit 10.

The received RF signals, which may be audio or data information, are routed to the demodulator 18 which converts the received RF signals into in-phase signal 22 and a quadrature signal 20. The in-phase and quadrature signals 20–22 are subsequently provided to the modulation signal converter 68 of the signal processing IC 24. The modulation signal converter 68 converts the analog in-phase and quadrature signals 20–22 into a digitized representation of the in-phase signal 188 and a digitized representation of the quadrature signal 190.

In addition to converting the analog signals 20–22 into digital signals 188–190, the modulation signal converter 68 formats the digital signals 188–190 into frames 180. As shown, a frame 180 may include a first data/audio section 184, a training sequence 182, and a second data/audio section 186. The data/audio sections 184–186 may contain either data information or audio information at any given time, but, from frame to frame, may alternatively support audio information and data information. The training sequence 182, or mid amble, contains training information that is utilized to determine the frame synchronization information and frame duration. For example, the frame synchronization information and duration provides information that allows the signal processing IC 24 to determine the beginning and ending of frames, which, as mentioned, is needed for the modem processing algorithm 92. The GSM standard prescribes the information contained within the training sequence, which is a given bit pattern. Thus, by knowing what the given bit pattern was supposed to be and comparing that with what was actually received, the frame boundary and synchronization can readily be determined.

After the modulation signal converter 68 has produced the digital in-phase signal 188 and digital quadrature signal 190, these signals are routed to the equalizer 124. The equalizer 124, which uses a Viterbi algorithm, includes a metric generator 194 and an add/compare/select (ACS) section 198. The metric generator 194, which is contained within the CPU 58 of FIG. 2, receives the digital in-phase signal 188, the digital quadrature signal 190, and the training sequence 182 and produces, therefrom, metric information 193 and in-phase and quadrature (I&Q) information 192, wherein the I&Q information 192 includes frame information and bit synchronization information.

The ACS section 198, which may be incorporated in the fourth co-processor 74 of FIG. 2 and being of the type disclosed in U.S. Pat. No. 5,027,374 issued to Mark Rossman, entitled "BIT SERIAL VITERBI DECODER ADD/COMPARE/SELECT ARRAY", assigned to the same assignee as the present invention, utilizes the metric information, which is a series of metrics, to perform a Maximum Likelihood Sequence Estimation (MLSE) equalization. In conjunction with performing the MLSE equalization, the ACS section 198 uses the I and Q information 192 to produce the equalized data stream 126.

The equalized data stream 126 is routed to the decryption element 128, when such an element is required. The decryption function 128 is performed within the central processing unit 58 and the third co-processor 64. The type of encryption algorithm used will depend upon the level of security required. The encryption/decryption function will be discussed in greater detail with reference to FIG. 25.

The equalized data stream 126, or the decrypted version of the equalized data stream 126, is received by the channel decoder 130. The channel decoder 130, which includes a deinterleave block 200, a block decoder 202, a cycle redundancy check (CRC) block 204, and a receive quality block 206, decodes the equalized data stream 126 to produce decoded information. The deinterleave block 200, which is performed with the CPU 58 of FIG. 2, receives the equalized data stream 126 and deinterleaves, in accordance with the GSM standard, the stream 126 to produce deinterleaved data. In essence deinterleaving is the opposite function of interleaving, where interleaving is taking a data stream and re-arranging the order of its bits, or bytes. For example assume that, at a given point in time, equation (1) is the original data stream, equation (2) is the interleaved data stream, equation (3) is the de-interleaved data stream, and the delay is 2:

$$A_0A_1A_2A_3A_4A_5A_6\ B_0B_1B_2B_3B_4B_5B_6\ C_0C_1C_2C_3C_4C_5C_6 \quad (1)$$

$$A_0Y_5Z_3A_1Y_6Z_4A_2B_0Z_5A_3B_1Z_6A_4B_2C_0A_5B_3C_1A_6B_4C_2 \quad (2)$$

$$Y_2Y_3Y_4Y_5Y_6Z_0Z_1Z_2Z_3Z_4Z_5Z_6A_0A_1A_2A_3A_4A_5A_6B_0B_1 \quad (3)$$

As illustrated, $Y0$–$Y6$, $Z0$–$Z6$, $A0$–$A6$, $B0$–$B6$, and $C0$–$C6$ each represent sequential codes words of the equalized data stream 126. Note the repetitive nature of the bit positions for the interleave data stream which has a pattern of 0-5-3-1-6-4-2, while the de-interleaved data stream is offset by 2. This occurs due to the delay selected, in this example 2. Thus, the bit pattern of the interleave data stream is a modulo function based on the delay.

Having deinterleaved the equalized data stream 126 to produce a deinterleaved data stream, the block decoder 202, which is incorporated in the fourth co-processor 74 and CPU 58 of FIG. 2, decodes the deinterleaved data stream. The block decoder 202 utilizes a convolutional decoding process as defined in the GSM standard. In essence, the convolutional decoding is the inverse function of the convolutional encoding which will be discussed in greater detail with reference to FIG. 21.

The block decoded data is then verified by the CRC block 204, wherein the CRC block 204 is incorporated in the third co-processor 64 of FIG. 2. To perform the verification, the CRC block 204 performs a CRC function as dictated by the GSM standard. In addition, the CRC block 204 performs an error correction function on the data to further enhance the accuracy of the information received. The final block of the channel decoder 130 is the received quality block 206, which is incorporated in the CPU 58 and the third co-processor 64 of FIG. 2, determines the quality of the RF signals 12 being currently received. Details of the receive quality block 206 will be discussed in detail with reference to FIG. 22.

The output of the channel decoder 130, which comprises the decoded audio information 132, is routed to the first audio processor 134 or the auxiliary interface 152. If the decoded audio information 132 is routed to the first audio processor 134, which may comprise a vo-coder 208 that is implemented within the CPU 58 of FIG. 2, the first audio processor 134 performs a speech decoding algorithm. The speech decoding algorithm may be a VSELP algorithm, a CELP algorithm, or a RPELTP algorithm. If the output of decoder 130 is routed to the auxiliary interface 152, it is sent to one of the peripheral devices as data output 160.

Figure 6:
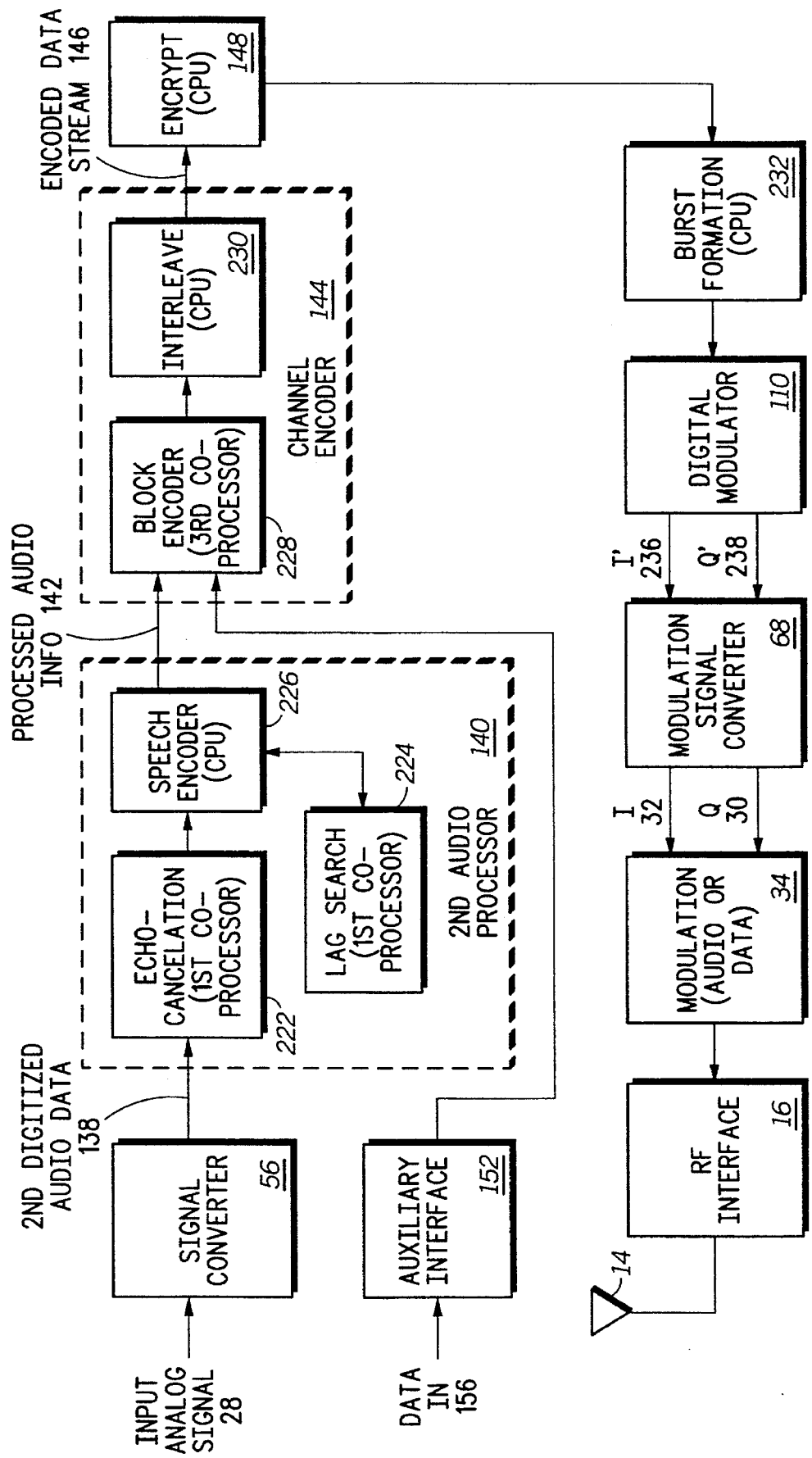
FIG. 6 illustrates a second portion of the signal processing integrated circuit in accordance with the present invention.

FIG. 6 illustrates the analog input to RF output path of the signal processing integrated circuit 24, 24A, 24B. As shown, there are two input paths: the input analog signal path which is information received from the microphone 28 and the data input path which is information received via the auxiliary data in 156. Input analog signals, which are generated by the microphone 28, are routed to the signal converter 56 which converts these signals into second digitized audio data 138.

The second digitized audio data 138 is routed to the second audio processor 140 which includes an echo cancellation section 222, a speech encoder 226, and a lag search section 224. The echo cancellation section 222, which is incorporated in the first co-processor 72 of FIG. 2, receives the second digitized audio data 138 and removes echo signals from the second digitized data 138. The output of the echo cancellation element 222 is routed to the speech encoder 226. Note that the echo cancellation element 222 will be discussed in detail below with reference to FIGS. 11–14.

The speech encoder 226, which is incorporated in the CPU 58, contemporaneously performs a portion of the audio coding algorithm 188 while the lag search section 224 is performing a lag search function to produce lag search information. The lag search element 224, which is incorporated in the first co-processor 72 of FIG. 2, will be discussed in detail below with reference to FIG. 15. The speech encoder 226 performs, utilizing the lag search information, a portion of the audio coding algorithm 88 in accordance with the GSM standards to produce the processed audio information 142. For example, the speech encoder may perform a VSELP algorithm, a CELP algorithm, or a RPELTP algorithm.

As the second audio processor 140 is generating the processed audio information 142, the processed audio information 142 is routed to the channel encoder 144. The channel encoder 144 includes a block encoder 228, which is incorporated within the third co-processor 64 of FIG. 2, and an interleave section 230, which is incorporated in the central processing unit 58. The block encoder 228 convolutionally encodes the processed audio information 142 and may also add CRC checks to produce encoded information. The block encoder 228 will be discussed in detail below with reference to FIG. 21.

The encoded information produced by the block encoder 228 is routed to the interleave block 230 which performs an interleave function that is in accordance with the GSM standard. In essence, the interleave function segregates data frames among the plurality of data frames to minimize the risk of data loss during transmission interferences or burst errors. An example of the interleave process was previously discussed. After the interleave section 230 has interleaved the encoded information, the channel encoder 144 outputs the encoded data stream 146. Note that the channel encoder 144 may also receive an input from the auxiliary interface 152, wherein the input received would be processed in a similarly manner as that described for the processed audio information 142.

The encryption element 148 receives the encoded data stream 146. The encryption element 148, which, when included, is incorporated in the CPU 58 and the third co-processor 64 of FIG. 2, performs the counterpart encryption algorithm to that of the decryptor 128. As mentioned above, the encryption algorithm that the encryption element 148 uses depends on the level of security desired within the communication unit 10. Recall that this may be an optional block.

The encoded data stream 146, or an encrypted version thereof, proceeds to a burst formation element 232, which is incorporated in the CPU 58 of FIG. 2. The burst formation element 232 formats the encoded data stream 146 into the frame block format 180 which is shown in FIG. 5. In addition to formatting the frame to include data/audio sections 184–186 and the training sequence section 182, the burst formation element 232 adds guard bits on either side of the burst, or data/audio sections 184–186.

Continuing with the discussion of FIG. 6, the output of the burst formation element 232 proceeds to the digital modulator 110 which produces the in-phase digital signal 236 and the digital quadrature signal 238. These signals are routed to signal modulator 68 which subsequently converts them into the analog interface and quadrature signals 32–30. These analog signals 30–32 are then routed to the modulator 34 which are subsequently transmitted via the antenna 14 and RF interface 16 as RF signals 12.

Figure 7:
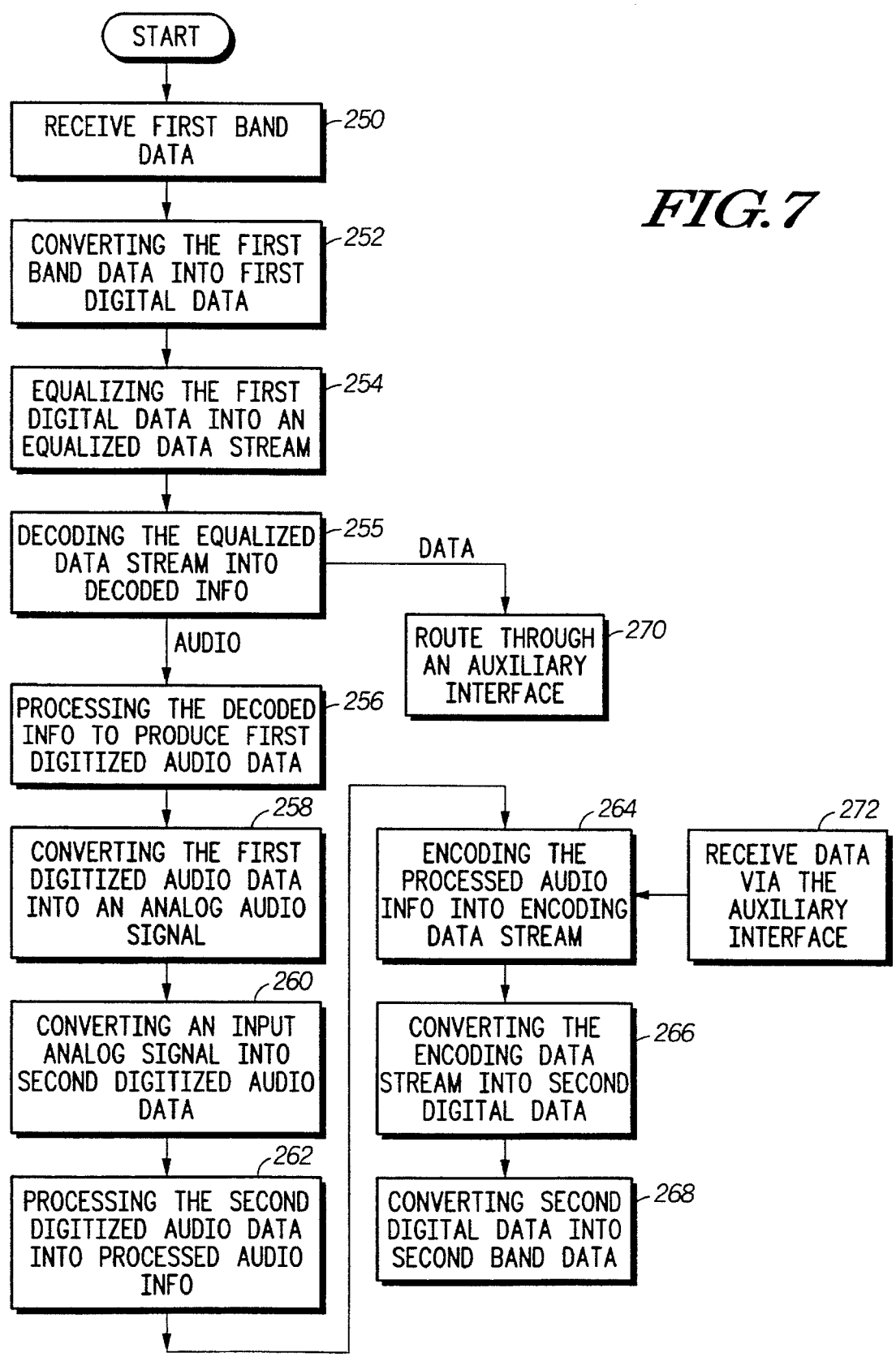
FIG. 7 illustrates a logic diagram that may be used to implement an embodiment of the present invention.

FIG. 7 illustrates a logic diagram that may be used to incorporate the present invention. At step 250, a first band data signal is received. The first band data signal is converted into a first digital signal at step 252. Upon making this digital conversion, the first digital data is then equalized into an equalized data stream at step 254. The equalized data stream is then decoded to produce decoded information at step 255. If the first band data is data information, it is routed to step 270 which in turn routes the data through an auxiliary interface to the appropriate digital equipment peripheral.

if, however, the first band data includes audio information, the decoded information is processed to produce first digitized audio data at step 256. Next, at step 258, the digitized audio is converted into an analog signal. The analog signal is then routed to an audio transducer such that the analog audio signal may be rendered audible.

For inbound analog or data signals, the signals are first converted at step 260 into second digitized audio data. At step 262, the second digitized audio data is processed to produce processed audio information. The processed audio information is then encoded at step 264 to produce an encoded data stream. Alternatively, at step 264, data information that has been received via an auxiliary interface as shown in step 272 is encoded to produce the encoded data stream. Regardless of how the encoded data stream was created, at step 266, the encoded data stream is converted into second digital data. Finally, at step 268, the second digital data is converted into second band data which is transmitted as RF signals.

Figure 8:
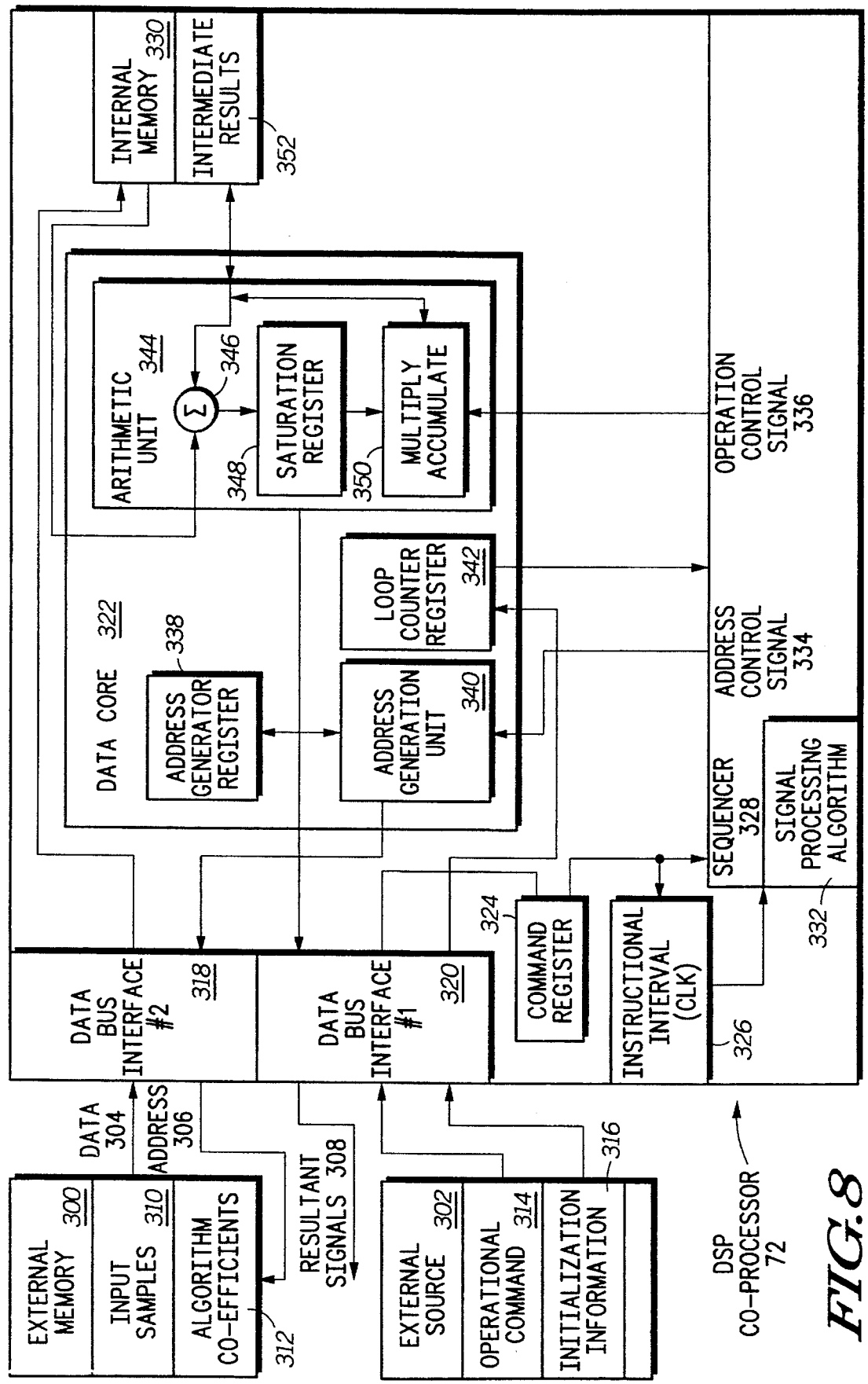
FIG. 8 illustrates a schematic block diagram of a first co-processor of the signal processing integrated circuit which is in accordance with the invention.

FIG. 8 illustrates a block diagram of the first co-processor, or digital signal processor (DSP) co-processor 72. As shown, the DSP co-processor 72 is coupled to an external memory 300 and an external source 302. The external memory 300 may be any form of digital memory such as RAM, ROM, and/or memory 70 of the signal processing IC 24. The external source 302 may be any element that can provide the DSP co-processor 72 with operational commands 314 and initialization information 316. For example, the external source 302 may be the central processing unit 58 of the signal processing IC 24.

The DSP co-processor 72 includes a first data bus interface 320, a second data bus interface 318, a data core 322, internal memory 330, a command register 324, an instructional interval generator, or clock generator, 326, and a sequencer 328. The sequencer 328 which may be a plurality of logic gates such as a programmable logic array, stores, in a hardware format, signal processing algorithms 332. The signal processing algorithms 332, may be an echo cancellation algorithm, a lag search algorithm, a finite impulse response filtering algorithm, an infinite impulse response filter, general filtering features, an audio correlation algorithm, and/or a fast fourier transform function.

The sequencer 328, in general, functions as a state machine which controls the execution of the data core 322 as it is performing one of the signal processing algorithms 322. As a state machine, the sequencer 328 provides, on an operational cycle basis, address control signals 334 and operational control signals 336 to the data core 322 until the signal processing algorithm 332 is complete. The state machine function of the sequencer 328 will be discussed in greater detail below with reference to FIG. 13.

While the sequencer 328 controls the data core's 322 execution of the signal processing algorithm 322, it does so under control of the external source 302. To enable the sequencer 328 to control the data core's 322 execution, the external source 302 provides the sequencer 328 an operational command 314 and initialization information 316 via the first data bus interface 320. The operational command 314 indicates which of the signal processing algorithms 332 are to be executed and is stored in the command register 324. Once the operational command 314 is stored in the command register 324, it is provided to the sequencer 328 and the instructional interval clock 326, such that the selected signal processing algorithm 332 may begin. For example, assume that the operational command 314 instructed the sequencer 328 to perform the echo cancellation algorithm. Upon receiving this command 314, the instruction interval clock 326 would begin sourcing an instruction interval to the sequencer 328, which, in turn, would begin providing operation control signals 336 and address control signals 334 to the data core 322.

As further illustrated in FIG. 8, the data core 322 includes an address generation unit 340, an address generation register 338, a loop count counter register(s) 342, and an arithmetic unit 344, wherein the arithmetic unit 344 comprises an adder 346, a saturation register 348, and a multiply-accumulate (MAC) section 350. The address generation unit 340 will be discussed in further detail below with reference to FIGS. 16–20, while the other data core components are commercially available integrated circuit components. For example, the loop counter register 342, the adder 346, the saturation register 348, and the MAC 350 may be similar components to those used in Motorola's DSP56001 or DSP56156. In addition to the elements shown, the arithmetic unit 344 may further include a subtraction function, a compare function, an absolute value function, a clear function, a negate function, a barrel shifter, priority encoder, logic units, a shift register, additional adders, and/or additional MACs. Many of these functions may be performed in parallel by providing additional address and data buses within the arithmetic unit 344. Note that the adder 346 may perform the additional functions of subtract, compare absolute value function, negate function, and clear function.

In addition to receiving the address control signals 334 and the operation control signals 336 from the sequencer 328, the data core 322 receives, via the first data bus interface 320, initialization information 316 from the external source 302. The initialization information 316 may be algorithm coefficients, an initial address pointer, an initial loop counter, number of accumulations, a rounding coefficient, a circular buffer pointer, an increment value, an ending address of a circular buffer, and/or a beginning address of a circular buffer.

Having received the initialization information 316 and an address control signal 334 and an operation control signal 336, the data core 322 begins executing the selected signal processing algorithm 332. In general, the data core 322, via its address generation unit 340, generates an address from the address control signal 334, wherein the address control signal 334 is a command signal instructing the address generation unit 334 to generate a new address. Thus, at instructional intervals, a new address is generated which is used to retrieve input samples 310 and algorithm coefficients 312 from the external memory 300. As the input samples 310 and algorithm coefficient 312 are being retrieved, they are stored in the internal memory 330.

While the address generation unit 340 is producing new addresses under the control of the sequencer 328, the arithmetic unit 344 is performing, based on the operation control signal 336, mathematical functions on intermediate results 352, the input samples 310, and the algorithm coefficients 312 that are stored in the internal memory 330 to produce new intermediate results 352. As the mathematical functions are being performed, the intermediate results 352 are being checked to determine whether an overflow condition has occurred, i.e., the maximum, or minimum, value that the arithmetic unit 344 can process has been exceeded. When an overflow condition occurs, the saturation register 348 provides an overflow, or saturation constant, as the final resultant for this particular series of operations. In addition to controlling the mathematical function, the operation control signal 336 controls the storing and retrieving of information from the internal memory 330.

As the data core 322 is performing the functions as dictated by the sequencer 328, the data core 322, via the loop counter register 342, provides loop count information to the sequencer 328. The loop count information informs the sequencer 328 of how many execution steps have been performed, such that the sequencer 328 can determine when the selected signal processing algorithm 332 has been completed. Once the signal processing algorithm 332 has been completed, the sequencer 328 and the instruction interval clock 326 are disabled until a new operational command 314 is received.

By incorporating the DSP co-processor 72, the signal processing IC 24 of FIG. 2 is able to meet the regulatory requirements, governmental requirements, and the consumer requirements. As mentioned, the sequencer 328 of FIG. 8 stores, in a hardware format, several signal processing algorithms such as an echo cancellation algorithm, a lag search algorithm, a finite impulse response filtering algorithm, an infinite impulse response filter, general filtering features, an audio correlation algorithm, and/or a fast fourier transform function. By storing this information in a hardware format, the DSP co-processor 72 is able to process the algorithms more quickly by eliminating the need to constantly read the operations from memory which is required for the CPU 58 of FIG. 2 to execute these algorithms. The DSP co-processor 72 is also faster than if the signal processing algorithms were being executed off chip by a separate digital signal processor or microprocessor. In addition to being faster, the DSP co-processor 72 also consumes less power that the CPU approach or the off chip approach. The power savings comes from disabling the DSP co-processor 72 when it is not being used, and when it is being used, the DSP co-processor 72 has a dedicated bus to the external memory 300. By having the dedicate bus, it can be shorter in length, provided the chip layout positions the external memory 300 near the DSP co-processor 72, such that the parasitic capacitance is lower requiring less power to drive the bus "high" or "low".

Figure 9:
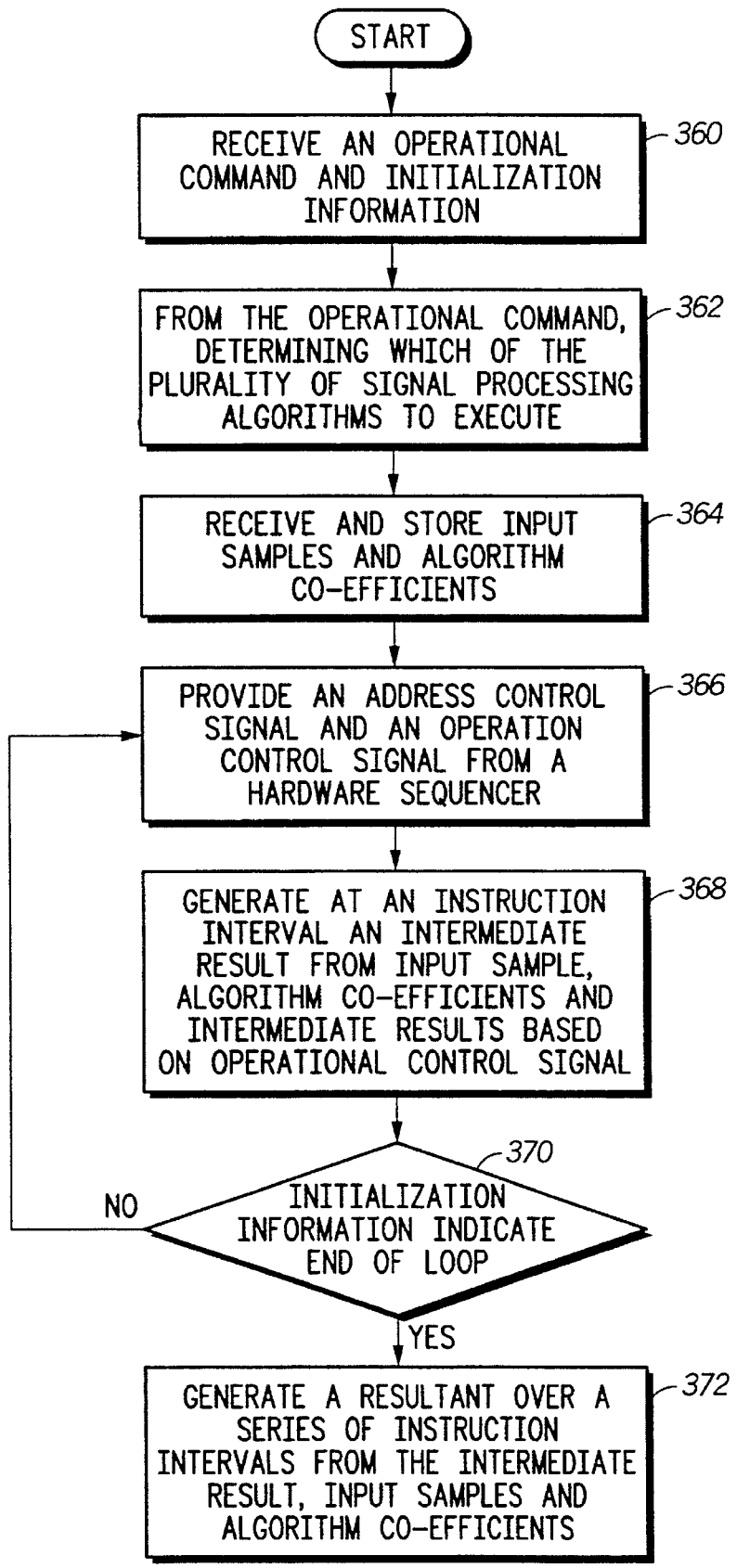
FIG. 9 illustrates a logic diagram that may be used to implement an embodiment of the first co-processor in accordance with the present invention.

FIG. 9 illustrates a logic diagram that may be used to implement the DSP co-processor 72. At step 360, an operational command and initialization information is received. From the operational command, at step 362, a determination is made as to which of the plurality of signal processing algorithms is to be executed. Having determining which of the signal processing algorithms is to be executed, input samples and algorithm coefficients are received and stored in an external memory as shown at step 364. With the input samples and algorithm coefficients stored in the external memory, an address control signal is provided by a hardware sequencer such that an address can be generated to retrieve an input sample and an algorithm coefficient. Note that the initialization information is used to determine what the next address should be, wherein the initialization information includes an address offset value, a beginning address of a circular buffer, an ending address of the circular buffer, and an initial address pointer.

In addition to providing the address control signal, the hardware sequencer provides an operation control signal at step 366. The operation control signal causes, at an instruction interval, at least one executable step of the selected signal processing algorithm to be executed upon the retrieved input sample and the algorithm coefficient to produce an intermediate result, which is shown at step 368. Further, at step 368, a loop counter is incremented, wherein an initial loop count value and a total loop count is included in the initialization information. Once the intermediate result is generated, the process determines at step 370 whether the initialization information indicates the end of a loop. This is determined by comparing the newly incremented loop count with the total loop count. If the newly incremented loop count equals the total loop count, the process proceeds to step 372, otherwise the process proceeds to step 366. At step 372, a resultant is generated based on a series of execution steps that performed mathematical functions on the intermediate resultants, the input samples, and algorithm coefficient.

Figure 10:
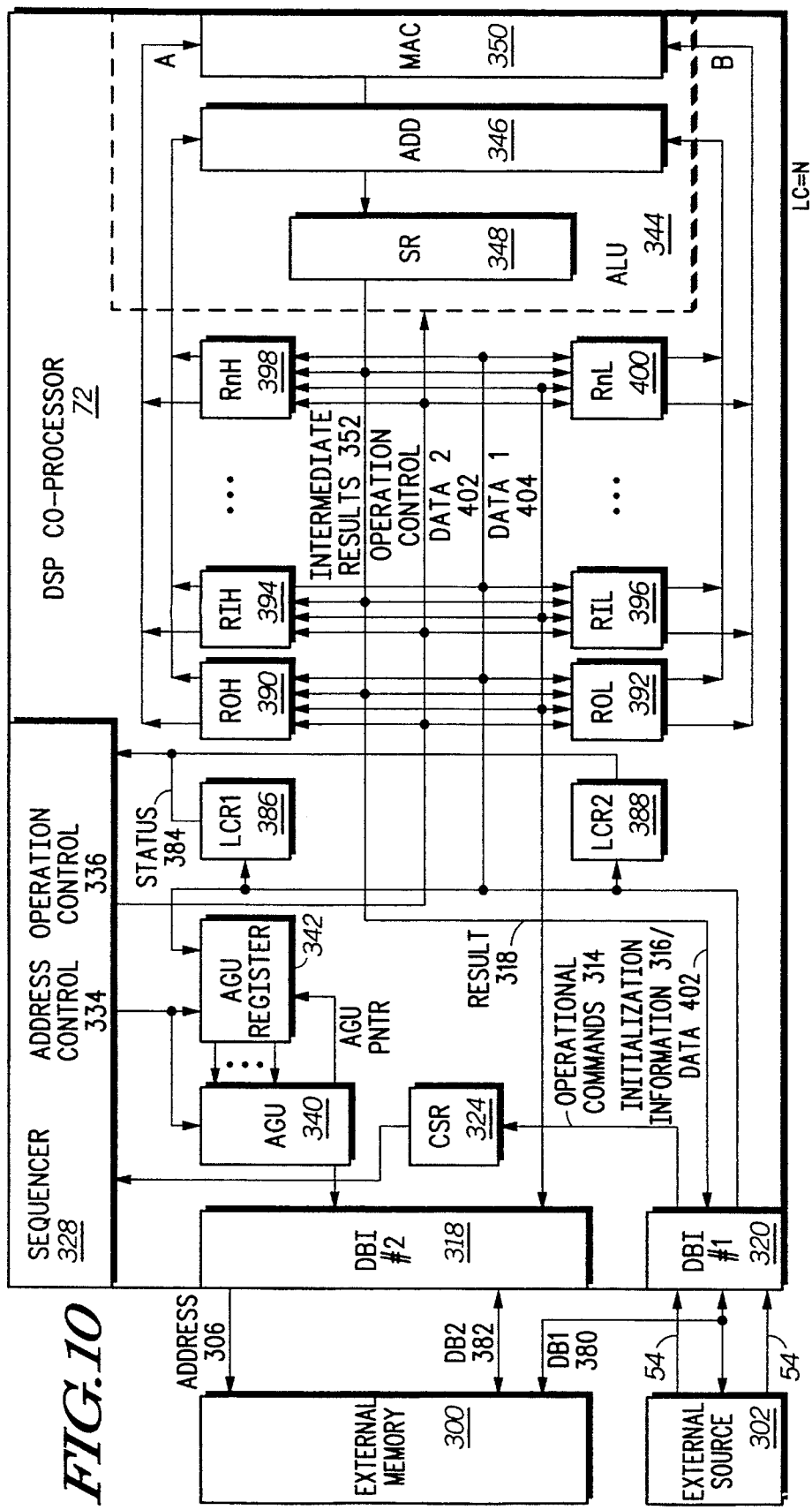
FIG. 10 illustrates a more detailed schematic block diagram of the first co-processor of the signal processing integrated circuit which is in accordance with the present invention.

FIG. 10 illustrates a more detailed block diagram of the DSP co-processor 72 coupled to the external memory 300 and the external source 302. The DSP co-processor 72 is coupled to external memory 300 via an address bus 306 and a first data bus 382, i.e., the dedicated bus, while it is connected to the external source 302 via a second data bus 380 and the control data bus 54. As previously mentioned, the dedicated data bus between the DSP co-processor 72 and the external memory 300 allows the DSP co-processor and the CPU 58 of FIG 2 to simultaneously execute certain operations, thus saving instruction cycles. In addition, the dedicated bus reduces power consumption because it takes less energy to drive the bus high or low.

In operation, the DSP co-processor 72 is idle until it receives an operational command 314 and initialization information 316 from the external source 302. The operational command 314 is stored in the command register 324, while the portions of the initialization information 316 are stored in the loop counter registers 386–388 and other portions are stored in the address generation register 342. The portions that are stored in the loop counter registers 386–388 include an initial loop count value, number of accumulations, or a total loop count. The portions that are stored in the address generation register 342 include an address offset value, a beginning address of a circular buffer, an ending address of the circular buffer, and an initial address pointer.

Once the initialization information 316 and the operational command 314 are stored, the operational command 314 is provided to the sequencer 328 which determines the signal processing algorithm of the plurality of signal processing algorithms 332 it is to execute. Having made this determination, the sequencer 328 begins to provide, at instructional intervals, address control signals 334 to the address generation unit 340 and operational control signals 336 to the arithmetic unit 344 and a plurality of general purpose registers 390–400. Each of the plurality of general purpose registers 390–400, wherein each register may be an addressable 16 bit register, is coupled to the arithmetic unit 344, the first data bus interface 320, the sequencer 328, and the second data bus interface 318 via an address/control/data bus, or a plurality of address/control/data buses. Note that the address/control/data bus(es) used may each be a 32 bit bus, or a pair of 16 bit buses.

To begin execution of the selected signal processing algorithm, the address generation unit 340, upon receiving the address control signal 334, generates an address, which, for the initial step, is the address pointer of the initialization information. The newly generated address is routed to the external memory 300 via the second data bus interface 318, wherein the newly generated address is used to retrieve data from the external memory 300. The retrieved data, which may be an input sample 310 and/or an algorithm coefficient 312, is routed to at least one of the general purpose registers 390–400 for storage. The operational control signal 336 dictates which general purpose register will store the retrieved data.

With data stored in at least one of the general purpose registers 390–400, the sequencer 328 generates, at the next instructional interval, another address control signal 334 and another operational control signal 336. The new address control signal 334 instructs the address generation unit 340 to generate a new address which is used to retrieve data from the external memory 300. The new operational control signal 336 may include a variety of instructions. For example, the instruction may be for the arithmetic unit 344 to perform a mathematical function, to transfer data from one general purpose register to another, store the intermediate resultant of the arithmetic unit 344 in one of the general purpose registers, to increment the status 384 (i.e., increment the loop count), to route data to either one of the data bus interfaces 318–320 for external use, route data 403–404 from a general purpose register to the arithmetic unit 344, and/or erase information stored in at least one of the general purpose registers.

The sequencer 328 continues to provide address control signals 334 and operational control signals 336 until the status 384 indicates that the selected signal processing algorithm is complete. Recall that the initialization information 316 included information regarding the total loop count and/or the number of cycles to be executed, which is stored in the command/status register 324. From this information, the status 384 is continually updated throughout the execution of the selected signal processing algorithm, until it reached the total loop count. Once the status indicates the end of the selected signal processing algorithm, the instructional interval clock 326 and the sequencer 328 are disabled until the external source 302 sends a subsequent operational command 314.

Figure 11:
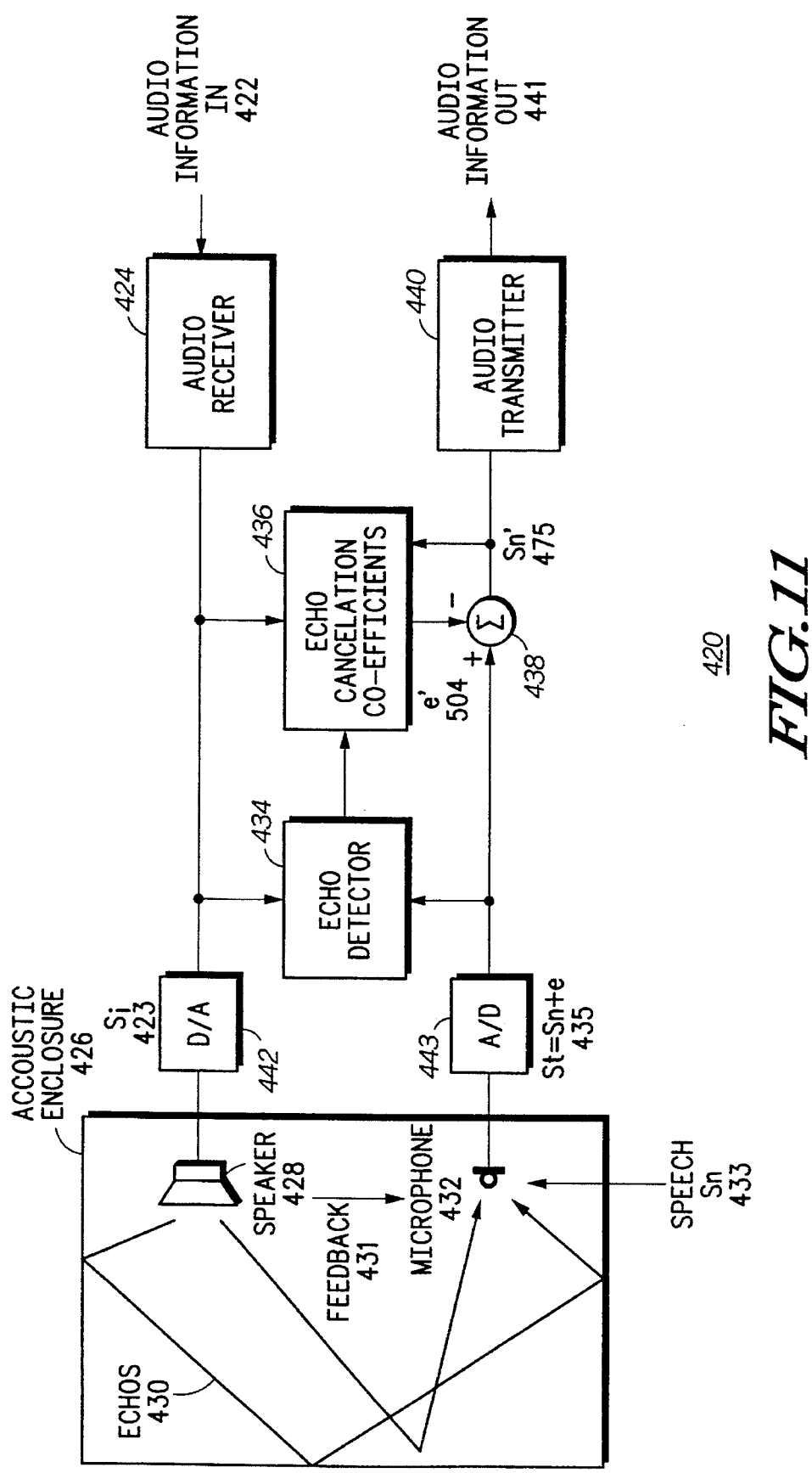
FIG. 11 illustrates an exemplary diagram of an echo cancellation circuit which is in accordance with the present invention.

To further illustrate the operation of the DSP co-processor 72, the echo cancellation function will be described with reference to FIGS. 11–14 and the lag search function will be described with reference to FIG. 15. FIG. 11 illustrates a generic echo cancellation environment 420. The generic echo cancellation environment 420 includes an audio receiver 424, an acoustic enclosure 426, a speaker 428, a microphone 432, an echo detector 434, an echo cancellation co-efficient section 436, an adder 438, and an audio transmitter 440. In general, the audio receiver 424 receives, and subsequently decodes, the audio information 422 to produce a digitized audio information $(S_i)$ 423.

The digitized audio information $(S_i)$ 423 is received by and convened into an analog signal by the digital-to-analog (D/A) 442. The analog signals are routed to the speaker 428 which renders the analog signals audible. The audible tones generated by speaker 428 are received by the microphone 432 as echoes 430 and/or as direct feedback 431. The echoes 430 result as the audible tones generated by the speaker 428 bounce off the boundaries of the acoustic enclosure 426, wherein the acoustic enclosure 426 may be a room, a conference room, or automobile. The direct feedback 431 results from the audible tones being directly received by the microphone 432.

In addition to receiving the echoes 430 and feedback 431, the microphone 432 may receive speech signals 433 ($S_n$). As the microphone 432 is receiving audible signals, whether they be echoes 430, feedback 431, or speech 433, the microphone 432 converts the audible signals into analog signals. The analog signals are sourced to an analog-to-digital (A/D) converter 443 that digitizes the analog signals to produced digitized audio ($S_t$) 435. The digitized audio ($S_t$) 435 is the summation of the echo signals (e) 430, the feedback signals 431, and the speech signals ($S_n$) 433. For the remainder of this discussion, whenever echo signals 430 are mentioned, it can be assumed that the echo signals include the feedback signals.

The digitized audio ($S_t$) 435 is routed to the adder 438 which subtracts an echo signal (e') 504 from the digitized audio (St) 435 to produce a representation of speech ($S_n$') 475. The representation of speech signals ($S_n$') 475 is subsequently converted into audio information 441 by the audio transmitter 440.

To produce the echo signal (e') 504, the echo cancellation coefficient section 436 scales the digitized audio information ($S_i$) 423 by echo cancellation coefficients. To determine the echo cancellation coefficients, the echo detector 434 compares the energy in the digitized audio information ($S_i$) 423 with the energy in the digitized audio ($S_t$) 435. If the energies are similar, i.e. no speech is being provided into microphone 432, the echo detector 434 provides a signal to the echo cancellation coefficient section 436 to begin calculating the echo cancellation coefficients. Calculation of the coefficients is an iterative process, wherein the coefficient section 436 attempts to generate an echo signal (e') that matches the digitized audio (St) 435 by adjusting the coefficients. Once the coefficient section 436 has produced an echo signal (e') that matches the digitized audio ($S_t$) 435, the output of the adder 438 is zero and the coefficients have been established.

If, however, the energies of the digitized audio ($S_t$) and the digitized audio information ($S_i$) do not match, i.e., the microphone 432 is receiving speech ($S_n$), the echo detector 434 sends a signal to the echo cancellation co-efficient section 436. Upon receiving the signal, the echo cancellation co-efficient section 436 switches modes of operation, in that, the echo cancellation co-efficient section 436 stops calculating the coefficients and multiplies the current echo cancellation coefficients with the digitized audio information ($S_i$) 423 to produce the echo signal (e') 504. The echo signal (e') 504 is then subtracted from the digitized audio ($S_t$) 435 to produce a representation of the speech ($S_n$'). If the coefficients are accurate, the echo signal (e') generated is very close to the echo 430 received by the microphone 432, such that the representative of speech ($S_n$') is substantially identical to the speech ($S_n$) 433 received by the microphone 432. Note that when the acoustic enclosure 426 and the positioning of the microphone 432 and the speaker 428 are fixed, the coefficients only need to be calculated once, however, when any one of these elements change position, the coefficients must be recalculated.

Figure 12:
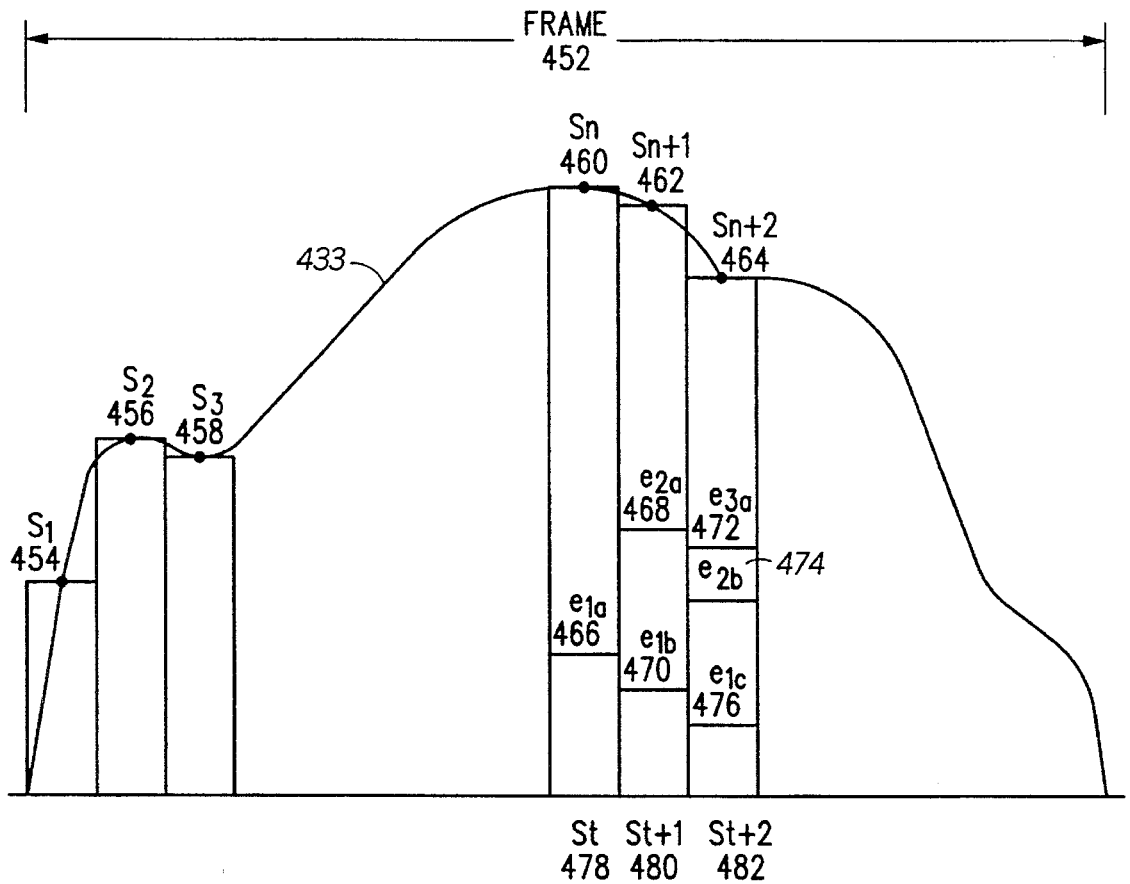
FIG. 12 illustrates a pictorial representation of an audio signal being sampled and echo signals being added thereto which is in accordance with the present invention.

FIG. 12 illustrates a portion of the analog speech signal 433 which is periodically sampled by the A/D converter to produce digitized speech samples 454–464. As shown, the first three digitized speech samples 454–458 are free from an additive echo sample. Thus, the resulting representative speech ($S_n$') equals the speech samples 454–458 because the echo cancellation co-efficient section did not generate an echo signal (e'). Sometime later, the digitized audio ($S_t$) 478 is produced from an echo sample ($e_{1a}$) 466 and the digitized speech sample ($S_n$) 460, which is shown as equation 461. To recapture an approximation of the speech sample ($S_n$) 460, or a representation thereof ($S_n$'), an echo signal (e') must be generated by the echo cancellation co-efficient section to represent the echo sample ($e_{1a}$) 466. The echo signal (e') is then subtracted from the actual digitized audio ($S_t$) 478 to produce the representation of the speech ($S_n$').

At the next sample interval, the actual digitized audio ($St_{t+1}$) 480 comprises a digitized speech sample ($S_{n+1}$) 462, a digitized echo sample ($e_{1b}$) 470, and a digitized echo sample ($e_{2a}$) 468, which is shown in equation 463. The digitized echo sample ($e_{1b}$) 470 is produced by the same echo that produce the digitized echo sample ($e_{1a}$) 466, while the echo sample (e2a) is produced by another echo. Recall that an echo decays as it bounces around the acoustic enclosure until it reaches a level that is unperceivable to the human ear, this represents the decay period. Thus, to recapture the representation of the speech ($s_{n+1}$'), the echo cancellation co-efficient section generates an echo signal (e') that equates to the digitized echo samples ($e_{1b}$) 470 and ($e_{2a}$) 468 which is then subtracted from the actual digitized audio ($S_{t+1}$) 480.

At a subsequent sample interval, the actual digitized audio ($S_{t+2}$) 482 comprises a digitized speech sample ($S_{n+2}$) 464, a digitized echo sample ($e_{1c}$) 476, a digitized echo sample ($e_{2b}$) 474, and a digitized echo sample ($e_{3a}$) 472, which is shown in equation 465. The digitized echo sample ($e_{1c}$) 476 is produced by the same echo that produced the digitized echo sample ($e_{1a}$) 466, while the echo sample (e2b) 474 is produced by the echo that produced digitized echo sample (e2a) 468, and digitized echo sample (e3a) 472 is produced by yet another echo. Thus, to recapture the representation of the speech ($s_{n+2}$'), the echo cancellation co-efficient section generates an echo signal (e') that equates to the digitized echo samples ($e_{1c}$) 476, ($e_{2b}$) 474, and ($e_{2a}$) 472 which is then subtracted from the actual digitized audio ($S_{t+2}$) 482.

As can be seen from the above, to recapture digitized speech, the digitized echo samples are subtracted from the actual digitized audio, which is shown in equation 467. Recall that the digitized echo samples are a plurality of sequential decaying echo samples. As shown in equation 469, the echo samples are represented by: $e_{na}+e_{(n-1)b}+e_{(n-2)c}+\ldots$ The actual digitized audio ($S_t$) is shown in equation 471 to be $Sn'+\Sigma(e_{(n-i)_i})$ from $0<i<M$, wherein M represents the number samples in echo decay time period. Solving equation 471 for $S_n$' yields equation 473, $S_n'=S_t-\Sigma(e_{(n-i)_i})$.

The digitized echo samples may be generated by multiplying the digitized audio information (Si) by echo coefficients, such that each digitized echo sample may be represented by the equation $e_i=a_iS_i$. Substituting the echo sampling equation into equation 473 yields equation 475, $S_n'=S_t-\pi a_i(s_{(n-i)_i})$, wherein M represents the number samples in echo decay time period.

Figure 13:
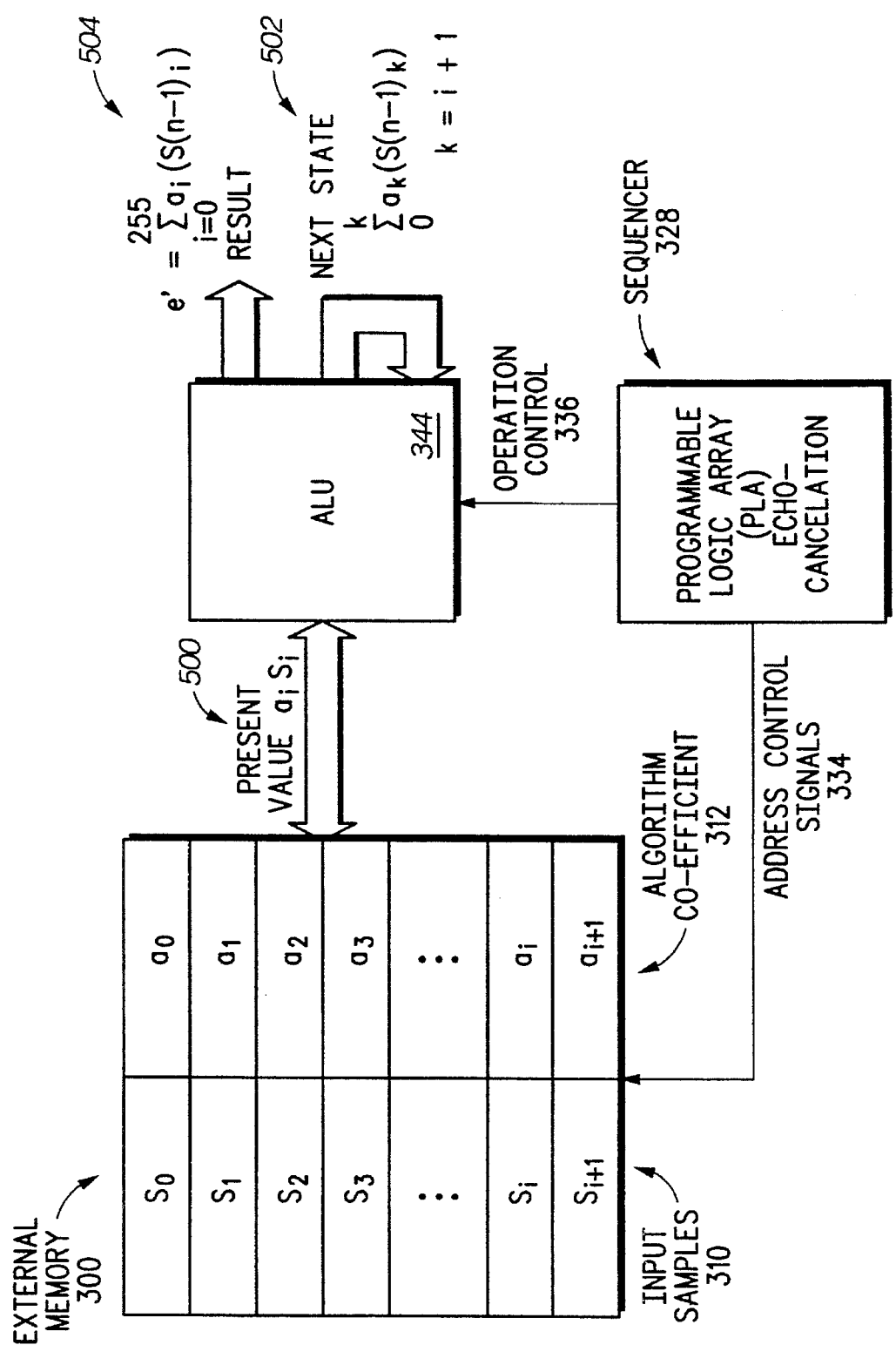
FIG. 13 illustrates an example of the first co-processor executing a portion of an echo cancellation algorithm in accordance with the present invention.

FIG. 13 illustrates how the first co-processor 72 of FIG. 8 executes the equations of the echo cancellation process discussed in FIGS. 11 and 12. As shown, the external memory 300 stores a plurality of input samples ($S_O$)–($S_{i+1}$) 310 and algorithm coefficient ($a_O$)–($a_{i+1}$) 312. The input samples 310 comprise samples of the digitized audio information 423, while the coefficients are generated by the echo cancellation co-efficient section 436 of FIG. 11. In operation, the sequencer 328 sends an address control signal 334 to the external memory 300 to retrieve an input sample 310 and a corresponding algorithm coefficient 312. In addition, the sequencer 328 sends an operation control signal 336 to the ALU 344, wherein the ALU 344 produces, based on the operation control signal, a present value 500 (i.e., an echo signal (e')) from the retrieved input sample ($S_i$) and the retrieved co-efficient ($a_i$).

The ALU 344 then generates the next state 502 by adding the present value 500 with a previous summation or intermediate resultant. This process is repeated until a resultant echo signal (e') 504 has been generated, which may be from 10 to 300 iterations. Thus, for each digitized audio sampled ($S_i$) 435, the echo cancellation program is executed, under the control of the sequencer 328, to produce the resulting echo signal (e') 504. For example, the DSP co-processor 72 produces the digitized audio ($S_{i+2}$) 482 of FIG. 12, when the sequencer generates a first address control signal and a first operational control signal. The first address control signal causes the DSP co-processor 72 to retrieve the digitized audio information sample ($S_1$) and the first co-efficient ($a_1$). The first operation control signal causes the ALU 344 to multiply $S_1$ and $a_1$ to represent the digitized echo sample (e3a) 472. Next, the sequencer 328 generates a second address control signal and a second operation control signal. The second address control signal causes the DSP co-processor 72 to retrieve the digitized audio sample ($S_2$) and the second co-efficient ($a_2$), which are multiplied together by the ALU 344 based on the second operation control signal to represent the digitized echo sample ($e_{2b}$). In addition, the operation control signal instructions the ALU 344 to produce and store an intermediate result based on a summation of the representation of ($e_{3a}$) and the representation of ($e_{2b}$). Next, the sequencer 328 generates a third address control signal and a third operation control signal. The address control signal causes the DSP co-processor 72 to retrieve a third digitized audio sample ($S_3$) and a third coefficient ($a_3$). The operation control signal instructs the ALU to multiply $S_3$ and a3 to represent the echo sample ($e_{1c}$). Finally, the operation control signal instructs the ALU to add the previous intermediate result to the echo sample ($e_{1c}$) to produce a resulting echo signal (e'). The resulting echo signal (e') is subtracted from the digitized audio ($S_i$) to recapture a representation of speech ($S_n'$). Having done this, the process repeats for the next digitized audio information sample ($S_i$).

Figure 14:
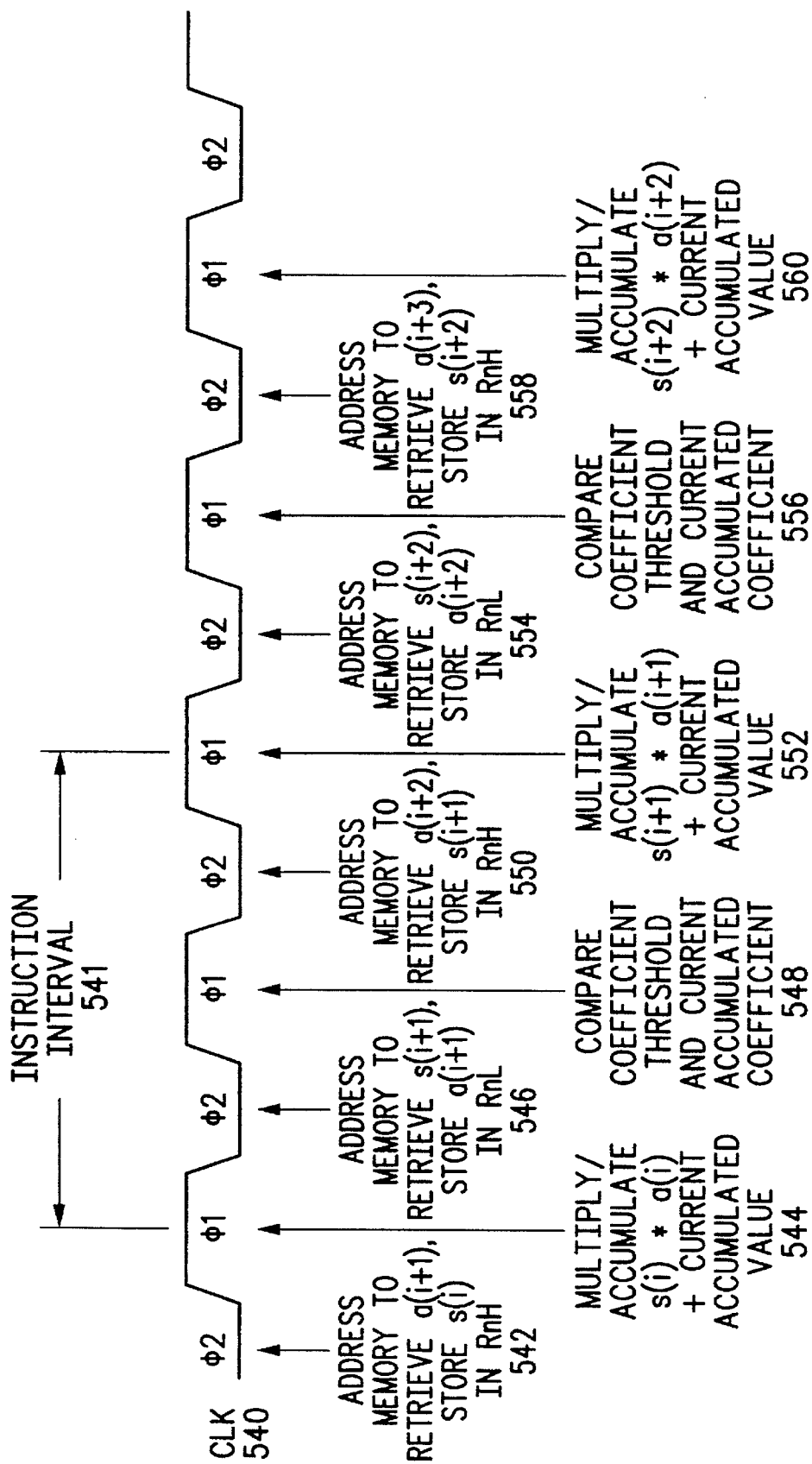
FIG. 14 illustrates a corresponding timing diagram for the example of FIG. 13.

FIG. 14 illustrates a timing diagram of the echo cancellation processed discussed in FIGS. 11–13. As shown, a clock signal 540 is used to sequence the operational steps wherein several clock cycles comprise an instruction interval 541. During Ø2 of a clock 540, the external memory 300 is addressed to retrieve an algorithm coefficient 312 ($a_{i+1}$) and to store an input sample 310 ($S_i$) in one of the general purpose registers. At the next Ø1 of the clock 540, a multiply accumulate function is performed between the input sample 310 ($S_i$) and the algorithm coefficient 312 ($a_i$) to produce a product which is then added to the current accumulate value or present value 500. At Ø2 546, the external memory 300 is again addressed to retrieve the next sample ($S_{i+1}$) and to store the algorithm coefficient 312 ($A_{i+1}$) in one of the general purpose registers. Next, at Ø1 548, a comparison is made between the current accumulated coefficient and a coefficient threshold. If the current coefficient exceeds the coefficient threshold, the coefficient is updated by the ALU 344 and stored in the external memory 300. If the threshold is not exceeded, no changes occurs, i.e., the external memory contains the most current co-efficient that has been generated by the echo cancellation co-efficient section 436 of FIG. 11.

At Ø2 550, the external memory is again address to retrieve the next algorithm coefficient 312 ($A_{i+2}$) and the input sample 310 ($S_{i+1}$) is stored in one of the general purpose registers. Next, at Ø1 552, a multiply accumulate function is performed by multiplying the input sample 310 ($S_{i+1}$) with the algorithm coefficient 312 $A_{(i+1)}$ to produce a present value 500 which is then added to the previous or intermediate result to produce a new intermediate result. Having performed this function, a complete instruction interval 541 has been achieved. Thus, during the next instruction interval 541, the external memory is addressed during Ø2 540 to retrieve input sample 310 $S_{(i+2)}$ and the algorithm coefficient 312A $S_{(i+2)}$ is store in one of the general purpose registers. At Ø1 556, the current accumulated coefficient is then compared with the threshold, i.e., is the external memory storing the most current coefficients, and if exceeded the external memory 300 is updated, and if not exceeded, no changes. At Ø2 558, the external memory is addressed to retrieve an algorithm coefficient 312 $A_{(i+3)}$ and the input sample 310 $S_{(i+2)}$ is stored in one of the general purpose memories. Having stored this information, at Ø1 560, a multiply accumulate function is performed by multiplying the input sample $S_{(i+2)}$ with algorithm coefficient $A_{(i+2)}$ and adding this resultant with a previous current accumulated value to produce the next state 502. This process continues until the echo decay time period is achieved.

Figure 15:
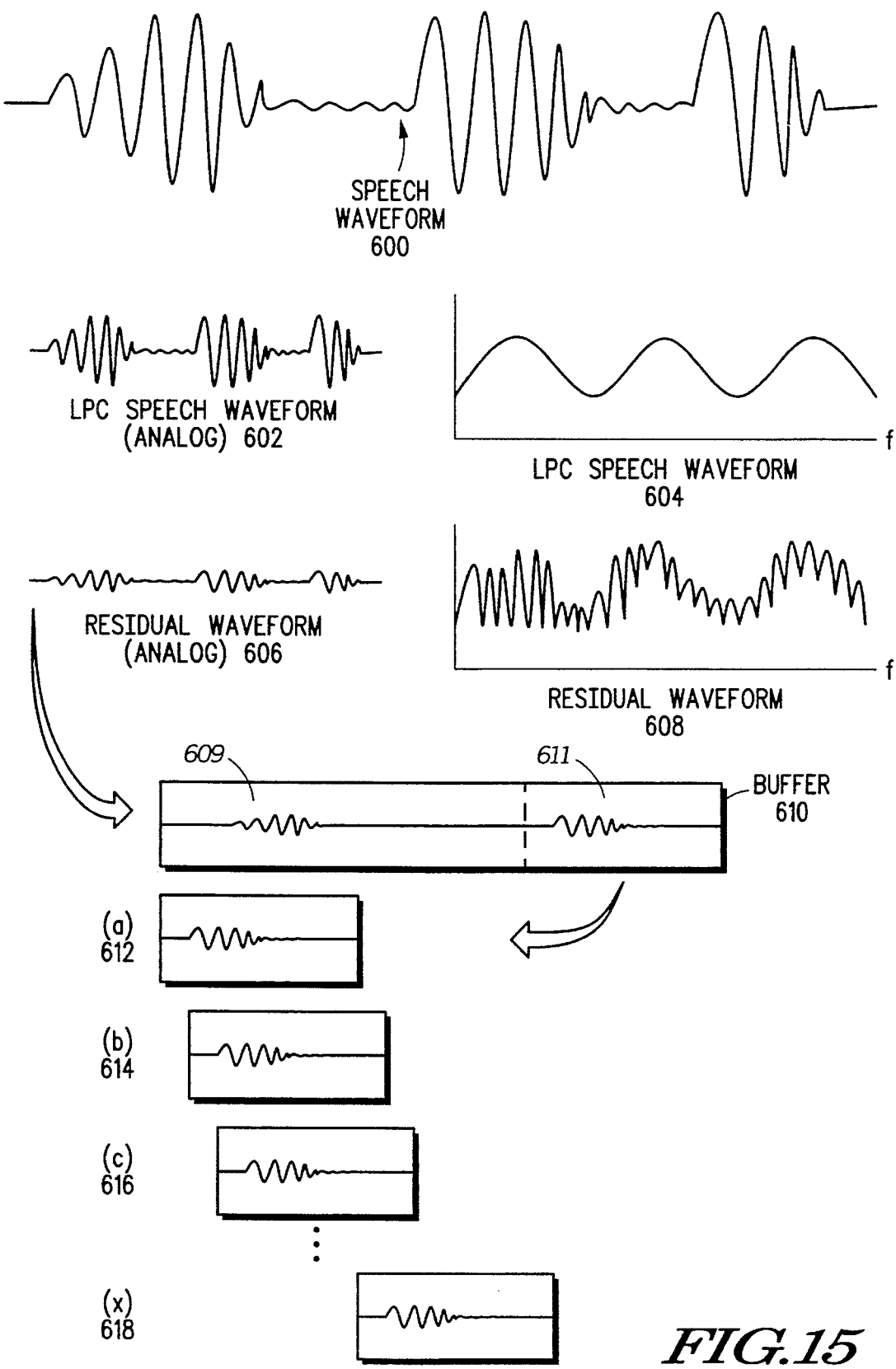
FIG. 15 illustrates a pictorial representation of a lag search algorithm which is performed by the first co-processor in accordance with the present invention.

FIG. 15 illustrates the lag search operation performed by the DSP co-processor, or first co-processor 72 of FIG. 8. As shown, a speech wave 600 is converted into a linear predicted code (LPC) speech wave form 602. The LPC operation is done by performing a filtering operation using LPC coefficients. This can be done using a 10 tap finite impulse response filter (FIR). Taking the LPC speech wave form 602 and subtracting it from speech wave form 600, the residual wave form 606 is formed. A frequency representation of both the LPC speech wave form 602 and the residual wave form 606 are shown as speech wave forms 604 and residual wave form 608, respectively. The speech wave form 604 shows the spectral information of the speech wave form 600 while the residual wave form 608 illustrates the pitch information of the speech wave form 600.

The residual wave form 606 is then stored in a buffer 610 which is segregated into a first portion 609 and a second portion 611. To determine the frequency of the pitch, the second portion 611 of the buffer 610 is auto-correlated with the first portion 609. During the auto-correlation process, the second portion 611 is multiplied with the first portion 609. The first step of the auto-correlation is shown at step (a) 612 which shows the first edge of the second portion 611 corresponding with the first edge of the first portion 609. At the next auto-correlation step (b) 614 the second portion 611 is incremented a step over in relationship to the first portion 609. This is repeated from step (c) through step (x) 618. Through the auto-correlation process, a maximum resultant may be determined which is used to determine the frequency of the pitch, the correlation peak value, and the location of the correlation peak within the buffer. By utilizing the hardware sequencer 328 of the DSP co-processor 72, the auto-correlation process can be done automatically thus improving the speed of the signal processing IC 24 of FIG. 2.

Figure 16:
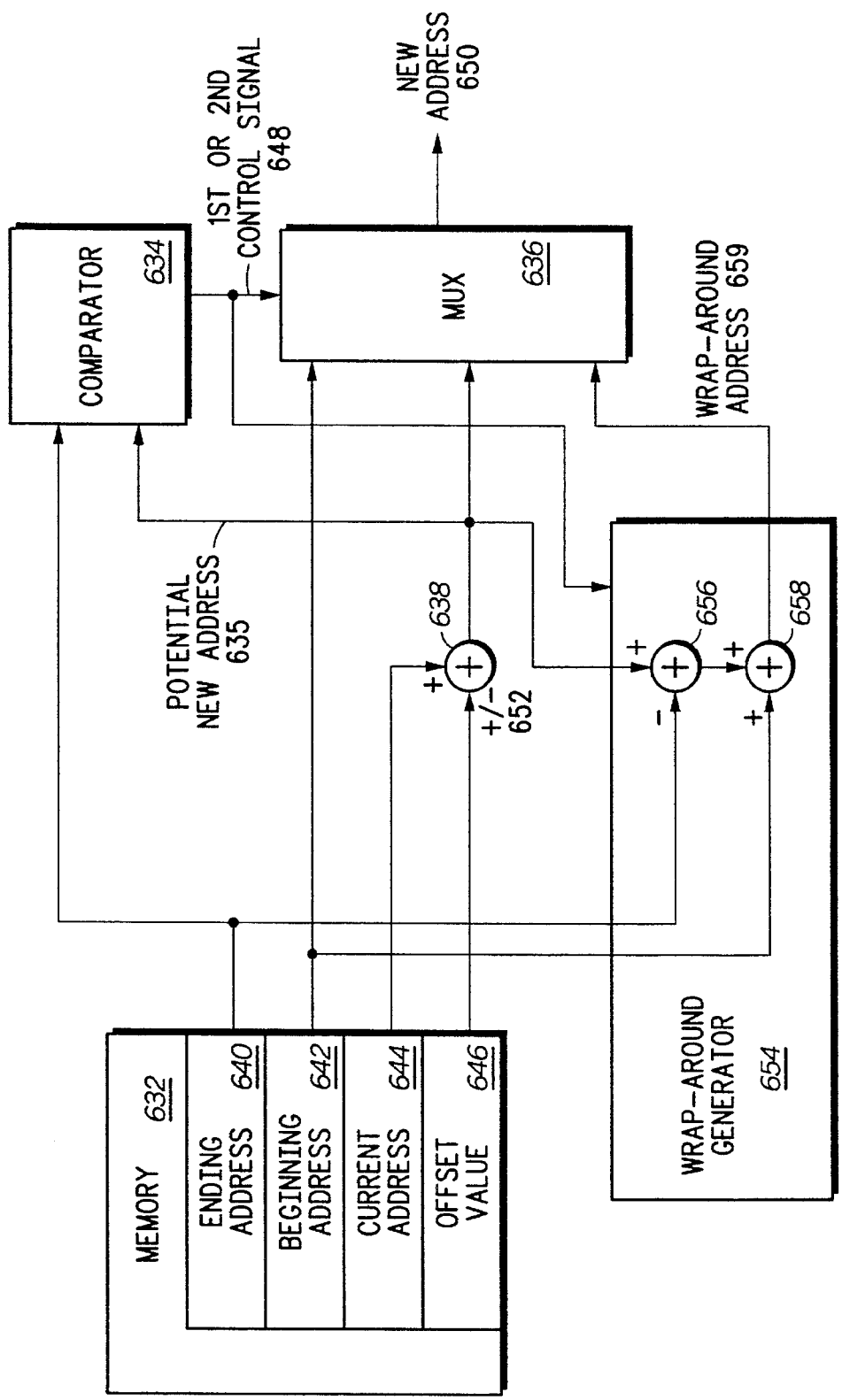
FIG. 16 illustrates a schematic block diagram of an address generation unit which is in accordance with the present invention.

FIG. 16 illustrates a schematic block diagram of a circular buffer addressing unit 630 which may be incorporated in the address generation unit 340 of FIG. 8. As shown, the circular buffer addressing unit 630 includes memory 632, a comparator 634, a multiplexer 636, an adder 638, and may also include a wrap around generator 654. The memory 632, which may be registers, RAM, or any other means for storing digital information, stores, for a circular buffer, an ending address 640, a beginning address 642, a current address pointer 644, and an offset value 646. The offset value 646 may be an increment value or a decrement value depending on how the circular buffer is utilized.

To generate a new address 650, the current address 644 and the offset value 646 are supplied to the adder 638. Depending on whether an increment or a decrement circular buffer is used, the offset value is added/subtracted 652 from the current value 644 to produce a potential new address 635. The potential new address is compared with the ending address 640 by the comparator 634. The comparator 634, which may be a subtraction element, or an equality comparator, compares, for an incrementing circular buffer, the ending address 640 with the potential new address 635. When the potential new address 635 is unfavorable, i.e., exceeds the ending address 640, the comparator 634 generates a second control signal 648. The second control signal 648 is supplied to the multiplexer 636 which instructs the multiplexer 636 to select the beginning address 642 as the new address 650. As an alternate to selecting the beginning address, the second control signal 648 may instruct the multiplexer 636 to select a wrap-around address 659.

The wrap around address 659 is generated by the wrap around generator 654 which includes two adders 656 and 658. The first adder 656 subtracts the ending address from the potential new address 635 to create an overflow value which is then added, by adders 658, to the beginning address 642 to produce the wrap around address 659.

Conversely, when the comparison between the potential new address 635 and the ending address 640 is favorable, i.e., the potential new address 635 is less than the ending address 640, the comparator 634 produces a first control signal 648. Upon receiving the first control signal 648, the multiplexer 636 selects the potential new address 635 as the new address 650.

If the circular buffer is a decrementing circular buffer, the potential new address 635 is compared with the beginning address 642 by comparator 634. When the potential new address is unfavorable, i.e., less than the beginning address, the comparator generates the second control signal instructing the multiplexer 636 to select the ending address as the new address 650. When the comparison between the potential new address 635 and the ending address 640 is favorable, i.e. the potential new address is greater than the ending address 640, the comparator generates a first control signal 648. Upon receiving the first control signal 648, the multiplexer 636 selects the potential new address 635 as the new address 650.

Figure 17:
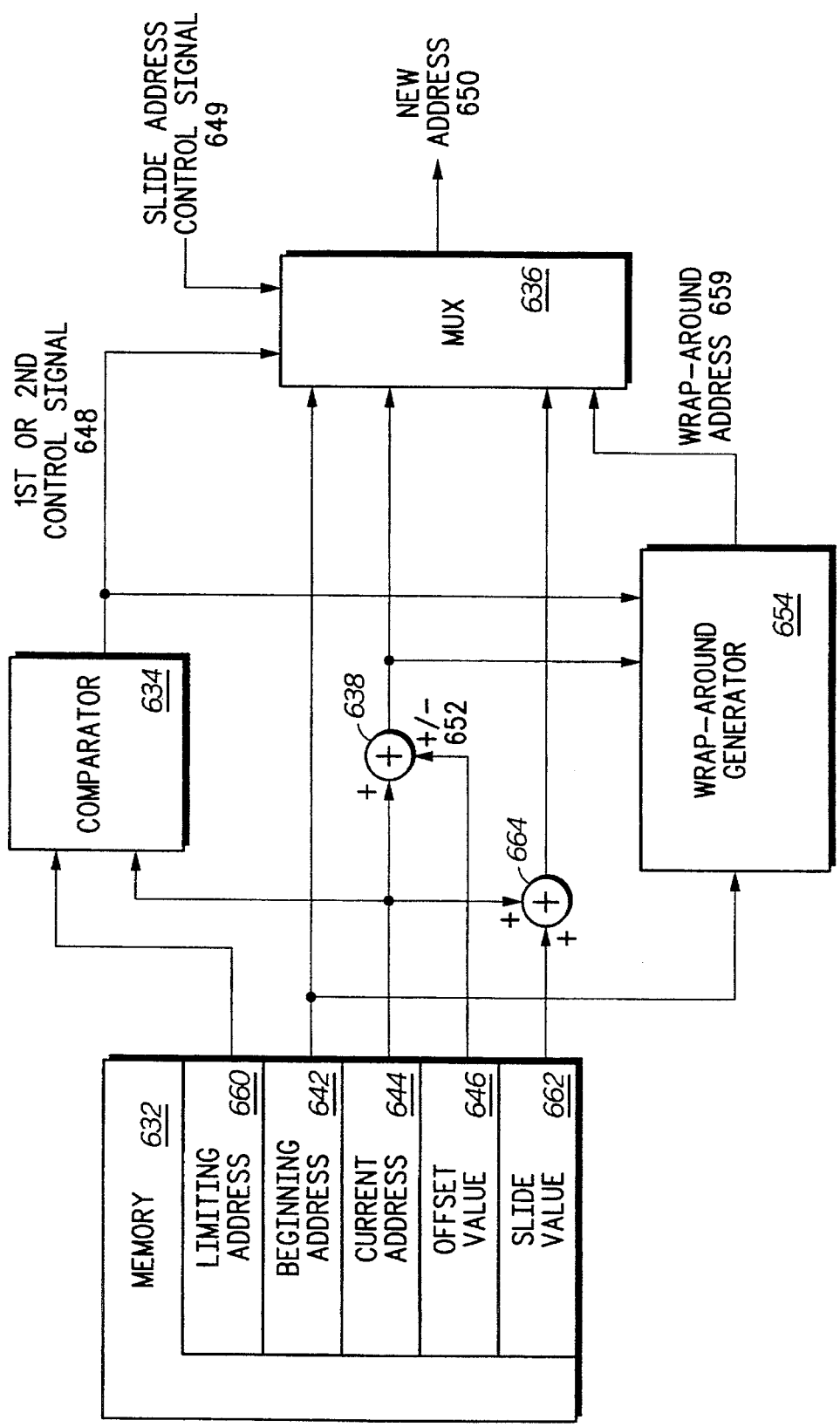
FIG. 17 illustrates an alternate schematic block diagram of an address generation unit which is in accordance with the present invention.

FIG. 17 illustrates an alternate embodiment for the circular address buffer 630a which may be incorporated in the address generation unit 340 of the DSP co-processor 72 of FIG. 8. As shown, the circular buffer address generator 630a includes memory 532, a comparator 634, a multiplexer 636, a first adder 638, a second adder 554, and may also include a wrap around generator 654. The memory 632 stores, for the circular buffer, a limiting address 660, the beginning address 542, the current address 644, the offset value 645, and may also include a slide value 662. The limiting address 660 is derived from the ending address 640 less the offset value 645. To generate the new address 650, the comparator 634 compares the limiting address 660 with the current address 644. When the comparison is unfavorable, i.e. the current address 646 exceeds the limiting address 660, the comparator 634 generates a second control signal 648. Upon receiving the second control signal, the multiplexer 636 selects, as the new address 650, the beginning address 642 or the wrap-around address 659.

When the comparison between the current address 644 and the limiting address 660 is favorable, i.e. the current address 644 is less than the limiting address 660, the comparator 634 generates the first control signal 648. Upon receiving the first control signal, the multiplexer 636 selects, as the new address 650, the resultant of the adder 638. The resultant of adder 638 is the summation of the current address 634 with the offset value 646. Note that for a decrement a decrementing circular buffer, the opposite of the above is true.

As shown, the memory also stores a slide value 662. The slide value 662 may be utilized in particular functions such as auto correlation where a new address is repetitively increment through the circular buffer with little chance for reaching the beginning or ending address. Under these conditions, the multiplexer 636 receives a slide address control signal 649 which instructs the multiplexer 636 to select, as the new address 650, the resultant of adder 664. The resultant of adder 664 is the summation of the current address 644 with the slide value 662. Note that the address generator 630a does not need to include adder 664 to provide the slide function. Instead, a slide control signal may be incorporated along with a feedback path from the new address 650 to the memory 632, such the slide control signals updates the slide address 662.

Figure 18:
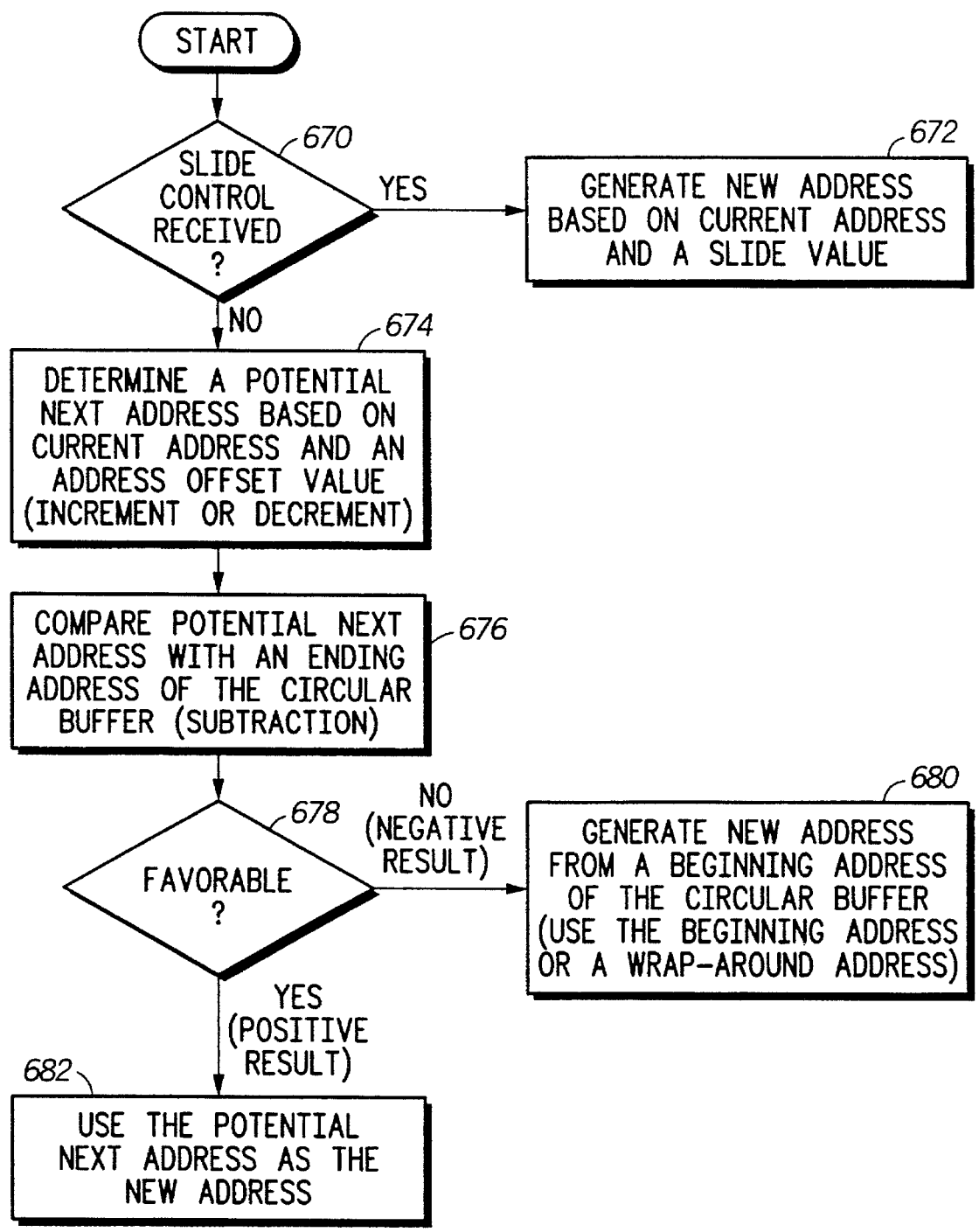
FIG. 18 illustrates a logic diagram that may be used to implement an address generation unit in accordance with the present invention.

FIG. 18 illustrates a logic diagram that may be used to implement an embodiment of a circular buffer address generation unit in accordance with the present invention. At step 670, the process determines whether a slide control signal has been received. If a slide control signal has been received, the process proceeds to step 672 wherein the new address is generated based on the current address and a slide value.

if, however, a slide control signal is not received, the process proceeds to step 674 wherein a potential new address is determined based on the current address and an address offset value. Note that this may be done in an incremental fashion or a decrement fashion depending on the design of the circular buffer. In general, the potential new address is a summation of the current address with the address offset value. The address offset value is a byte word or a double word value, i.e. eight bit, sixteen bit, or thirty-two bit word.

After generating the potential new address, the process proceeds to step 676 wherein the potential new address is compared with the ending address of the circular buffer. This comparison may be done by a subtraction of the potential new address from the ending address or an equality test. Regardless of how the comparison is made, the process proceeds to step 678 where it is determined whether the comparison is favorable. If the comparison was favorable, i.e. a positive result occurred from the subtraction or the equalization comparison was negative, the process proceeds to step 682 wherein the potential new address is used as the new address. If, however, the comparison was unfavorable, i.e. a negative result occurred from the subtraction, or the equalization test was positive, the process proceeds to step 680 wherein the new address is generated from the beginning address of the circular buffer. Under this condition, the new address may be the beginning address or a wrap around address depending on whether the circuit incorporates a wrap around generation unit.

Figure 19:
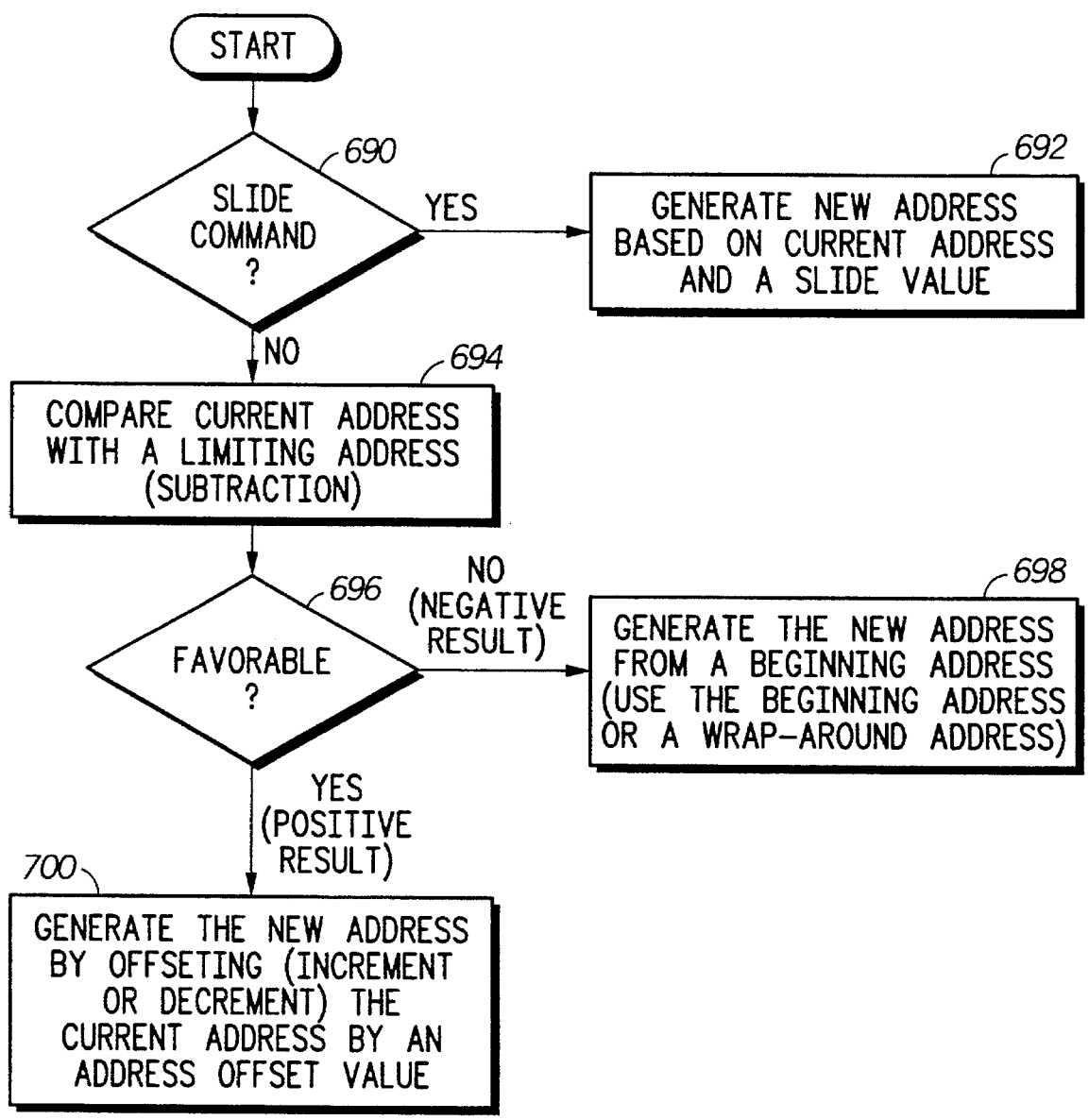
FIG. 19 illustrates a logic diagram that may be used to implement an alternate address generation unit in accordance with the present invention.

FIG. 19 illustrates a logic diagram that may be used to implement an alternate embodiment of the circular buffer address generation unit in accordance with the present invention. At step 690, the process determines whether a slide command has been received. If a slide command has been received, the process proceeds to step 692 wherein a new address is generated based on the current address and a slide value. As described above the new address is generated by adding the slide value to the current address.

If, however, a slide command has not been received, the process proceeds to step 694 wherein the current address is compared to a limiting address. Note that the limiting address is the ending address of the circular buffer less an address offset value. As with the logic diagram of FIG. 19, the comparison may be done by a subtraction method or an equalization method.

At step 696, the process determines whether the comparison was favorable or unfavorable. When the comparison was favorable, the process proceeds to step 700 where the new address is generated by offsetting, which may be incrementing or decrementing, the current address by an address offset value. If, however, the comparison was unfavorable, the process proceeds to step 698 wherein the new address is generated from the beginning address. As mentioned above, the new address may be the beginning address or a wrap around address.

FIG. 20 illustrates a comparison between a circular buffer address generation unit in accordance with present invention to a prior art circular buffer address generation unit. For the purposes of illustration, assume that the co-processor 72 requires 3 circular buffers each being 275 bits, or bytes, in length. In the prior art addressing scheme, circular buffers are generated based on a $2^K$ addressing scheme. With this constraint, the memory area 720 must be a 2K RAM, ROM, or any means for storing digital information. The first circular buffer 722 has its beginning address at 0 and has it's ending address at memory location 274. Due to the $2^K$ requirement, the second circular buffer 724 can not begin until the next $2^K$ address boundary. For this example, that occurs at $2^9$ or at address 512 and ends at address 787.

The third circular buffer begins at the next $2^K$ boundary 732 or, for this example, at $2^{10}$ or address 1024. The third circular buffer 726 therefore has its beginning address at address 1024 and its ending address at 1301. As shown, due to the $2^K$ boundary, there are several open memory areas 734–738 within the memory 720. While the open memory areas 734–738 may be used to store other digital information, they cannot store information that is intended for one of the circular buffers 722–726.

To further illustrate the $2^K$ boundary limitation, assume there are three current addresses 740, 742, 744, one in each circular buffer. The first current address 740 of the first circular buffer 722 is at address 128. To address this memory location, a base address 746 of 0000000 is used to identify the first circular buffer 722 and an actual address 748 of 001000000 to identify the 128th location in the first circular buffer. The second current address 742, which is in the second circular buffer 724, is at the 128th location. To produce a 16 bit address word for this current address, the base address 750 is 0000001, while the actual address 752 is 001000000. Thus, in combination, the total binary representation of the second current address 748 is the address 640. Similarly, the third current address number 744 has a base address 754 of 0000010 and an actual address 756 of 001000000. Thus, the third current address 744 is at address 1153.

In contrast, the circular buffering addressing techniques of the present invention shows a memory 760 which is 1K in length. As shown, the first circular buffer 722 has its beginning address at zero and its ending address at 274. The second circular buffer 724 has its beginning address at 275 and its ending address at 549 while the third circular buffer 726 has its beginning address 550 and its ending address at 824. As shown, there is no open memory between the circular buffers thus, the three circular buffers of 275 bit, or byte, length can be achieved within a 1K memory whereas the prior art requires a 2K memory to accommodate the three circular buffers.

Figure 21:
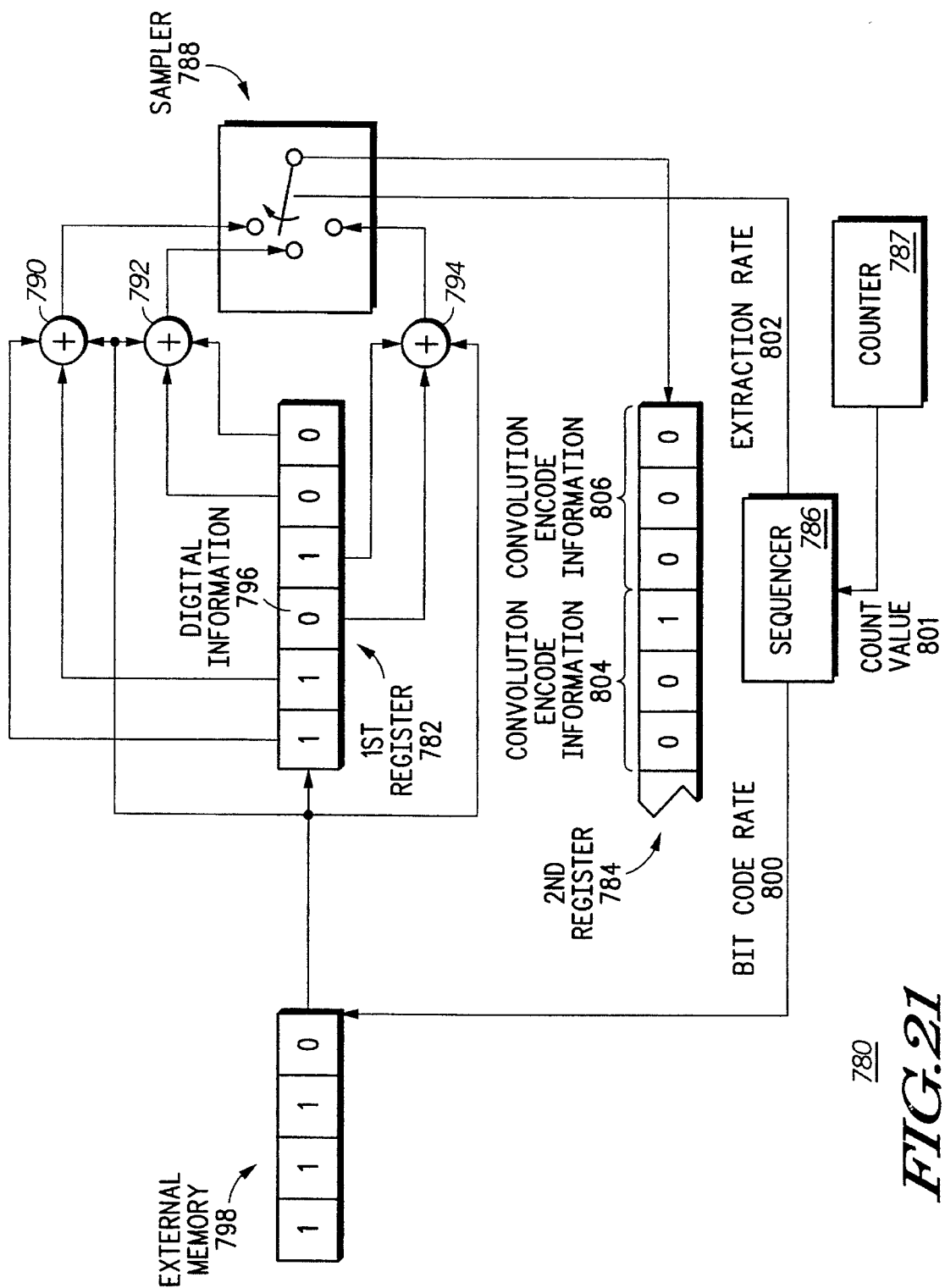
FIG. 21 illustrates a schematic block diagram of an encoder which is in accordance with the present invention.

FIG. 21 illustrates a block diagram of a convolutional encoder 780 which may be used in the block encoder 228 of the third co-processor 64 of FIG. 2. The convolutional encoder 780 includes a first register 782, a plurality of logic elements 790–794, a sampler 788, a second register 784, a sequencer 786, and a counter 787. In operation, the convolution encoder 780 receives digital information 796 from an external memory source 798 at a bit code rate, or code rate, 800. The external memory source 798 may be an input port of the third co-processor 64, or may be a register within the third co-processor or a linear shift register.

As shown, the sequencer 786 generates the code rate 800 and the extraction rate 802. This is done by utilizing the count value 801 generated by counter 787. The count value 801 is based on the size of the second register 784 which may be a linear shift register. For example, if the second register 784 is a 16 bit linear bit register, the count value 801 will be 16 or less. Each time the counter 787 cycles through the count values 801, which is received from the CPU 58 of FIG. 2, the convolutional encoder 780 is deactivated until it receives an enable signal from an external source such as the central processing unit 58 of FIG. 2. Upon receiving the enable signal, the sequencer 786 generates the extraction rate 802 based on the count value 801, which, in most applications, will equal the count value 801. The sequencer 786 also generates the code rate 800 as a divisor integer of the extraction rate, based on the number of logic elements 790–794. For example, the convolutional encoder 780 is shown to include three logic elements 790–794, thus the extraction rate will be one while the code rate will be one-third. This ratio is needed to allow for a single digital information bit 796 to be inputted to the first register 782, while the sampler 788 provides three samples to the second register 784, one for each of the logic elements 790–794. The logic element 790–794 may comprise any type of logic gates that produce a desired logic function. For example, each of the logic elements 790–794 may comprise an adder, wherein each adder receives two bits from the first register 782 and the incoming bit from the external memory 798. Note that this is just an example for one type of convolutional encoder, other types may be ½ encoders or ⅙ encoders.

From the example shown, logic 790 receives the first two bits of register 782 and the incoming digital information bit 796. The resultant from logic 790 produces an encoded sample which is routed to the sampler 788. The other logic elements 792, 794 also provide an encoded sample to the sampler 788, which may be a multiplexer controlled by the sequencer 786. Recall that the number of encoded samples provided to the sampler, which occurs during the extraction rate, is dependent upon the number of logic elements. The encoded samples supplied to the sampler 788 are then sampled, or extracted, at the extraction rate and supplied to the second register 784. For each bit of information supplied to the first register, based on a ⅓ code rate, three bits of information will be supplied to the second register 784. The bits supplied to the second register are shown as convolutional encoded information 804 and 806.

Figure 22:
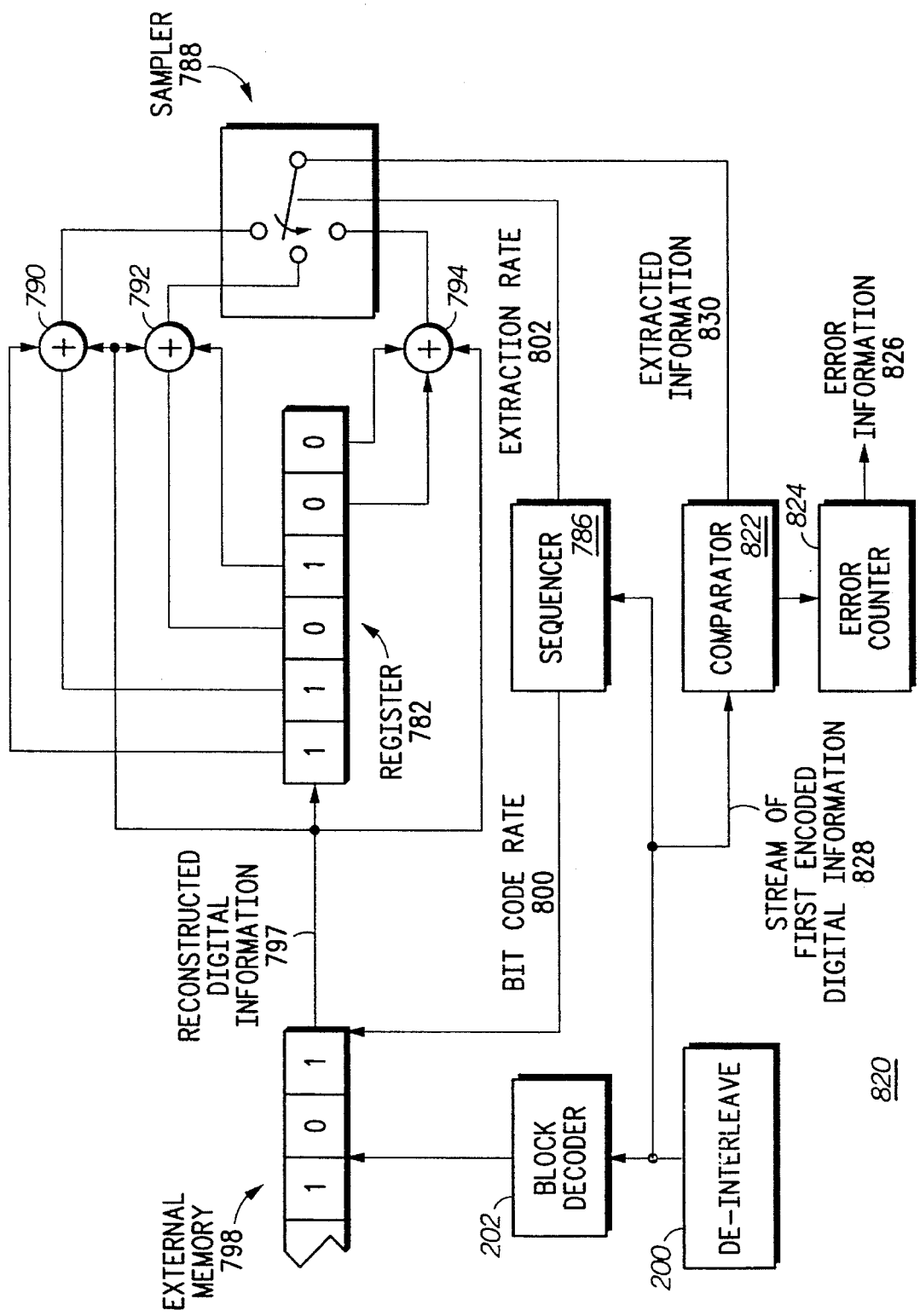
FIG. 22 illustrates a schematic block diagram of a signal quality checker which is in accordance with the present invention.

FIG. 22 illustrates a block diagram of a received signal quality checker 820 which may be incorporated in the third co-processor 64. As shown, the received quality checker 820 includes a register 782, a sampler 788, a plurality of logic element 790–794, a sequencer 786, a comparator 822 and an error count 824. In operation, the register 782 receives reconstructed digital information 797 from an external memory source 798. The reconstructed digital information 797 is the information that has been de-interleaved and decoded by the de-interleaver 200 and block decoder 202 of the channel decoder 130 of FIG. 5.

To verify the accuracy of the information being received, the deinterleaved information, or a stream of first encoded digital information 828, is compared with extraction information 830. The extracted information is generated from the reconstructed digital information 797 which is convolutionally encoded by logic element 790–794 and then sampled by sampler 788 at the extraction rate 802. The convolutional encoding process was discussed with reference to FIG. 21.

The comparator 822 performs the comparison of the sign of the stream of the first encoded digital information 828 and the extracted information 830 on a bit-by-bit basis. For each unfavorable comparison, i.e. the information did not match, the error counter 824 is incremented to produce error information 826. Note that the basic structure of the received quality checker 820 is substantially similar to the convolutional encoder 780 and shares many of the same components. Thus, the flexibility of the convolutional encoder 780 is applicable to the received quality checker 820 and in practice may utilize the same elements.

FIG. 23 illustrates a logic diagram that may be used to implement an embodiment of the convolutional encoder in accordance with the present invention. At step 850, digital information is received at a bit code rate. Having received this information, the process proceeds to step 852 wherein this information is convolutionally encoded to produce encoded samples based on the bit rate. The process next moves to step 854 wherein the encoded samples are extracted for a given encoded count, to produce a first number of encoded samples. Note that the given encoded count equates to the count value 801 produced by counter 787 of FIG. 21. Having generated the first number of encoded samples, the process proceeds to step 856 wherein the first number of encoded samples are stored as convolutionally encoded data.

FIG. 24 illustrates a logic diagram that may be used to implement the received quality checker of the present invention. At step 860, reconstructed digital information is received at a bit code rate. Having received this information the process proceeds to step 862 wherein the reconstructed digital information is convolutionally encoded based on the bit code rate to produce the first number of encoded samples. Next, at step 864, the first number of encoded samples are sampled to produce extracted information.

Next, the extracted information is compared with a stream of first encoded digital information. At step 868, it is determined whether the comparison of 866 is favorable. When the comparison is favorable, i.e., the information matched, the process repeats at step 860. If, however, the comparison was not favorable, i.e., the information did not match, the process proceeds to step 870 wherein an error count is incremented. Depending on the number of errors, the quality of the received signal can be determined.

Figure 25:
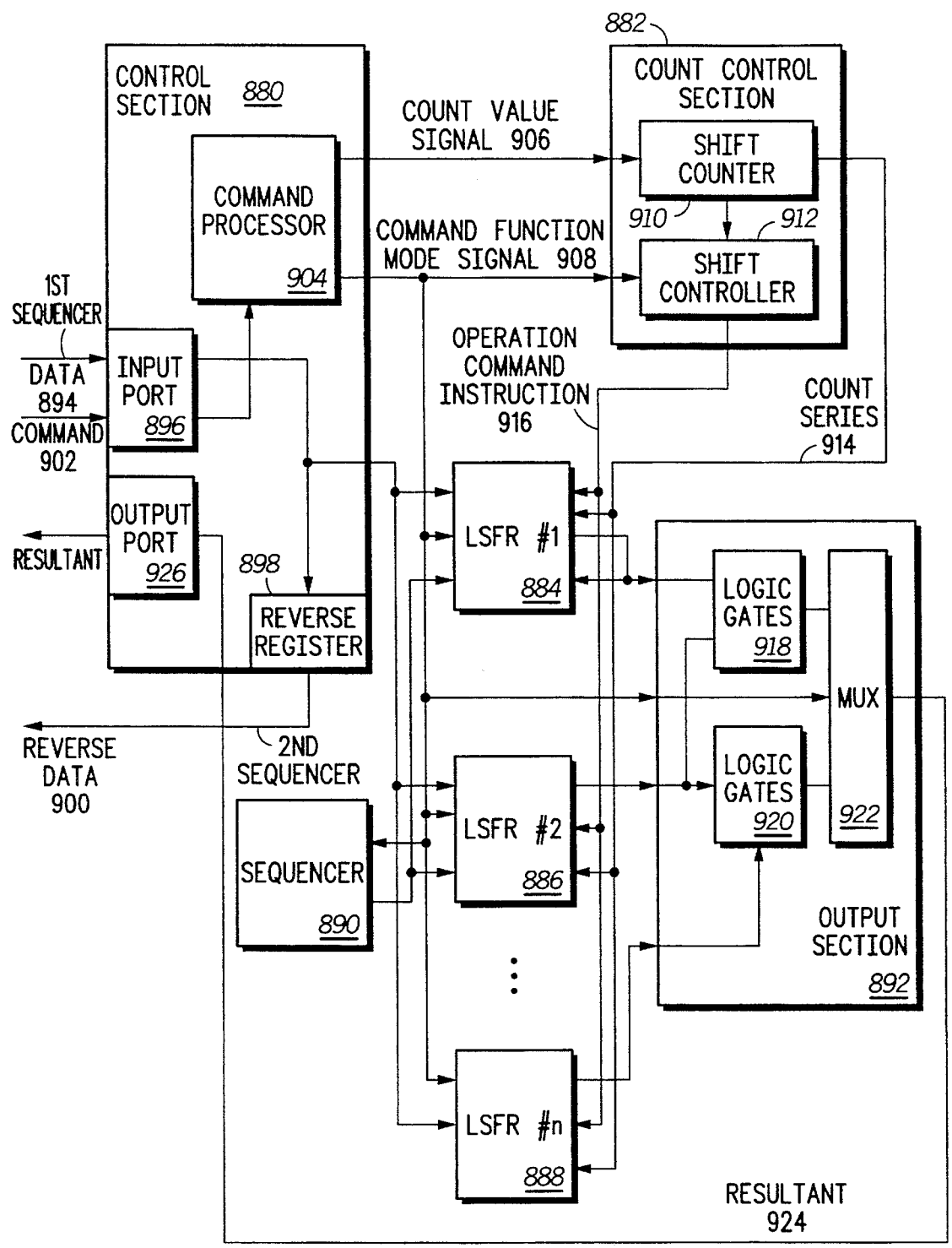
FIG. 25 illustrates a schematic block diagram of the third co-processor of the signal processing integrated circuit which is in accordance with the present invention.

FIG. 25 illustrates a block diagram of a portion of the third co-processor 64 of FIG. 2. As shown, this portion of the third co-processor 64 includes a control section 880, a control count section 882, a plurality of computation elements 884–888, a sequencer 890, and an output section 892. In operation, data 894 is received from an external source, such as a central processing unit 58, or memory 70, by an input port 896 of the control section 880. In addition to receiving the data 898, the control section 880, via the input port 896, receives commands 902. These commands may be generated by the central processing unit 58 wherein the commands are routed to the command processor 904. Depending on the command 902, the data 894 will be routed to a reverse register 898, or to the plurality of computation elements 884–888.

If the command 902 indicates that the data 894 is to be routed to the reverse register 898, the sequence of the data 894, or first sequence, is reversed to produce a second sequence. The second sequence data is then outputted as reverse data 900 which is returned to an external source such as memory 70 or the central processing unit 58. For example, if the first sequence of the data 894 is least significant bit (LSB) to most significant bit (MSB), then the reverse, or second sequence, will be MSB to LSB.

If, however, the command 902 indicates that the data 894 is to be used as input for one of the communication functions, it is routed to at least one of the computation elements 884–888. The communication functions include cycle redundancy check/error detection, cycle redundancy check/error correction, encryption sequence generation, decryption sequence generation, or cyclic redundancy check sequence generation. Many of these operations can be performed at various levels, for example, the encryption/decryption function may be a basic encryption algorithm, or an advanced encryption algorithm.

In addition to indicating that the data 894 is to be routed to at least one of the plurality computation elements 884–888, which may be linear shift feedback registers 884–888, the command 902 is processed by the command processor 904 to generate a count value signal 906 and a communication function mode signal 908. The control value signal 906 and the communication function mode signal 908 are routed to the count control section 882. A shift counter 910 of the count control section 882 generates a count series 914 based on the control value signal 906. A shift controller 912 of the count controller section 882 generates an operation command instruction 916 from the communication function mode signal 908. The operation command instruction 916 provides information to the linear shift feed back registers 884–888 as to when information is to be shifted to the output section 892. In addition, the operation command signal 916 indicates when the linear shift feedback registers 884–888 are to input or shift information, or data 894.

The linear shift registers 884–888 are configured based on the communication function mode signal 908. For example, if the communication function mode signal 908 indicates that an encryption algorithm is to be performed, each of the linear shift feedback registers 884–888 will be active to perform a portion of the encryption algorithm. As an alternate example, when the communication function mode signal indicates a Fire CRC check, only the first two linear shift feed back registers 884 and 886 will be configured to perform this function while the remaining linear shift feed back registers 888 will be inactive.

In addition to receiving the operation command instructions 916 and the communication function mode signal 908, the plurality of linear shift feedback registers 884–888 also receive additional control signals from the sequencer 890. The sequencer 890 generates these additional control signals from the communication mode signal 908. These additional control signals instruct the linear shift feedback registers 884–888 to preset information into the registers and to reset the registers to different values. Given the above mentioned information, the linear shift feedback registers 884–888 each generate output signals which are provided to the output section 892. The output section 892 is comprised of a plurality of logic gates 918–920 and a multiplexer 922. Each of the plurality of logic gates 918–920 is configured to perform a specific logic function depending on the communication mode. Based on the communication mode signal 908, the multiplexer 922 selects one of the logic gate 918–920 outputs as the resultant 924. The resultant 924 is then routed, via an output port 926 of the control section 880, to an external source such as the central processing unit 58 or the memory 70.

Figure 26:
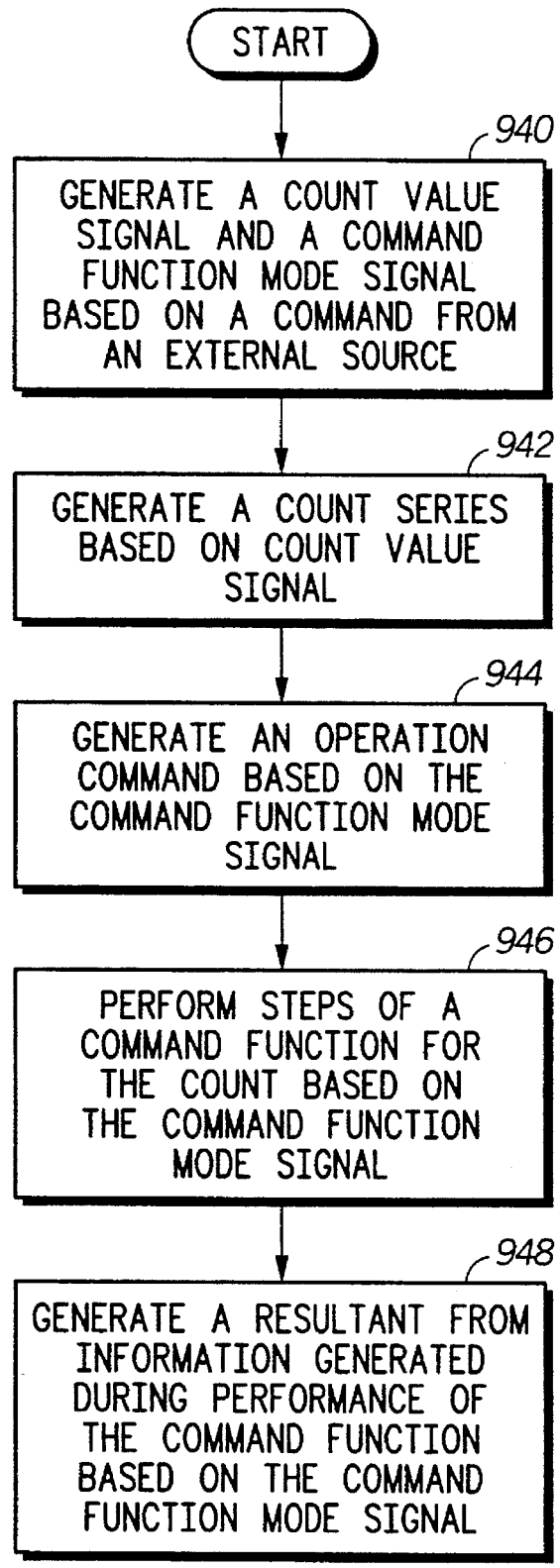
FIG. 26 illustrates a logic diagram that may be used to produce the third co-processor which is in accordance with the present invention.

FIG. 26 illustrates a logic diagram that may be used to implement a portion of the co-processor 64. At step 940, a count value and a communication function mode signal are generated based on a command signal received from an external source. Having generated these signals, the process proceeds to step 942 wherein a count series is generated from the count value signal. From the communication function mode signal, at step 944, an operation command signal is generated. With the operation command signal and count series being generated, the process proceeds to step 946 wherein a communication function is performed based on the communication function mode signal. At step 948, a resultant is generated, based on the communication function mode signal and information that was produced during performance of the communication function, wherein information is generated based on the count series. The resultant generated will then be stored in an output register.

In order to enhance the performance of the signal processing IC care must be taken in laying out the IC. For example, the signal processor 56 is a relatively noisy device which needs to be isolated from the noise sensitive areas. In addition, the DSP co-processor 72 provides a dedicated bus 382 to the external memory such that the DSP co-processor can simultaneously, or in parallel, perform one its signal processing algorithms in conjunction with the central processing unit 58 executing one of its functions. The signal converter 56 should be of a Nyquist rate sigma delta converter, over sampling, or a comparator type of converter. The memory 70 is shared between the co-processors and the central processing unit. For example, the CPU 58 may be able to read information from the memory location allocated to the first co-processor but may not write to it. When the first co-processor or DSP co-processor 72 has ceased functioning, this memory then becomes available for the central processing unit. In addition to these features, many of the input and outputs to the signal processing circuit have differential inputs and outputs thus providing common mode protection. Further, separate power supplies may be utilized for the noise sensitive circuits and for the noisy circuits such as the digital circuits.

The present invention provides a method and apparatus for generating a signal processing integrated circuit. The signal processing IC includes a central processing unit and a plurality of co-processors to perform communication functions such as echo cancellation lag search, encryption/decryption, convolutional encoding and decoding, error correction, equalization, and modem processing. In addition, the single integrated circuit signal processing circuit also performs speech encoding and decoding, tone generation and data processing such that a cellular telephone can interface with a personal computer, fax machine, external audio equipment, and other such devices. These features were not available in a single IC. Recall that prior art chip sets required at least three ICs to perform the basic communication function and a fourth IC to perform the echo cancellation function.

What is claimed is:

1. A convolution encoder comprising:
   a first register that receives digital information at a code rate;
   a plurality of logic gates operably coupled to the first register, wherein the plurality of logic gates performs a convolution encode function on the digital information received by the first register to produce, based on the code rate, a first number of encoded samples;
   a sampler operably coupled to the plurality of logic gates, wherein the sampler extracts the first number of encoded samples at an extraction rate to produce extracted information;
   a second register operably coupled to the sampler, wherein the second register receives the extracted information from the sampler;
   a counter that provides a count value; and
   a sequencer operably coupled to the first register and the plurality of logic gates, wherein the sequencer generates the code rate and the extraction rate based on the count value, and wherein the sequencer provides the code rate to the first register and the extraction rate to the sampler.

2. The convolution encoder of claim 1, wherein the plurality of logic gates comprises a plurality of adders.

3. The convolution encoder of claim 1, wherein the extraction rate comprises a function of the code rate.

4. A received signal quality checker, comprising:
   a first register that receives digital information at a code rate;
   a plurality of logic gates operably coupled to the first register, wherein the plurality of logic gates perform a convolution encode function on the digital
   information received by the register to produce, based on the code rate, a first number of encoded samples;
   a sampler operably coupled to the plurality of logic gates, wherein the sampler extracts the first number of encoded samples at an extraction rate to produce extracted information;
   a sequencer operably coupled to the first register and the plurality of logic gates, wherein the sequencer generates the code rate and the extraction rate and provides the code rate to the first register and the extraction rate to the sampler; and
   a comparator operably coupled to the sampler, wherein the comparator compares the extracted information with a stream of first encoded digital information, and when the extracted information compares favorably with the stream of first encoded digital information, accuracy of the digital information is confirmed, and wherein the digital information received by the register is derived from the stream of the first encoded digital information.

5. The received signal quality checker of claim 4, wherein the plurality of logic gates comprises a plurality of adders.

6. The received signal quality checker of claim 4, wherein the extraction rate comprises a function of the code rate.

7. The received signal quality checker of claim 4 further comprises an error counter, wherein the error counter counts each time the extracted information compares unfavorably with the stream of first encoded digital information.

8. A method for convolutionally encoding a digital information, the method comprising the steps of:
   receiving the digital information at a bit code rate;
   convolutionally encoding the digital information based on the bit code rate to produce a first number of encoded samples;

extracting the first number of encoded samples at an extraction rate;

storing the extracted first number of encoded samples;

counting the extracted first number of encoded samples to produce an encoding count; and outputting the extracted first number of encoded samples as convolution signals when the encoding count reaches a predetermined value.

9. A method for determining quality of reconstructed digital information, the method comprising the steps of:

receiving the reconstructed digital information at a bit code rate;

convolutionally encoding the reconstructed digital information based on the bit code rate to produce a first number of encoded samples;

sampling the first number of encoded samples at an extraction rate to produce extracted information; and comparing the extracted information with a stream of first encoded digital information, and when the extracted information compares favorably with the stream of first encoded digital information, accuracy of the digital information is confirmed and wherein the reconstructed digital information is derived from the stream of the first encoded digital information.

10. The method of claim 9 further comprises counting each occurrence of an unfavorable comparison between the extracted information and the stream of first encoded digital information to produce an error count.

* * * * *